United States Patent
Yamazaki

(10) Patent No.: US 8,512,493 B2
(45) Date of Patent: Aug. 20, 2013

(54) METHOD OF MANUFACTURING OPTICAL FILTER, ANALYTICAL INSTRUMENT, AND OPTICAL APPARATUS

(75) Inventor: Seiji Yamazaki, Fujimi (JP)

(73) Assignee: Seiko Epson Corporation (JP)

( * ) Notice: Subject to any disclaimer, the term of this patent is extended or adjusted under 35 U.S.C. 154(b) by 290 days.

(21) Appl. No.: 13/045,607

(22) Filed: Mar. 11, 2011

(65) Prior Publication Data

US 2011/0222160 A1   Sep. 15, 2011

(30) Foreign Application Priority Data

Mar. 15, 2010   (JP) ................................. 2010-058302

(51) Int. Cl.
*C03C 27/00* (2006.01)
*E06B 3/24* (2006.01)
*G01B 11/02* (2006.01)
*G02F 1/03* (2006.01)
*G02F 1/07* (2006.01)

(52) U.S. Cl.
USPC ............................ 156/109; 356/506; 359/260

(58) Field of Classification Search
USPC ................. 359/577–590, 260; 356/450–521; 156/99–109
See application file for complete search history.

(56) References Cited

U.S. PATENT DOCUMENTS

| 7,141,297 B2 | 11/2006 | Condo et al. |
| 2003/0008180 A1 | 1/2003 | Bajt et al. |
| 2003/0048970 A1 * | 3/2003 | Cole et al. .......................... 385/1 |
| 2004/0233530 A1 | 11/2004 | Kramer et al. |
| 2006/0008200 A1 * | 1/2006 | Nakamura et al. ............... 385/15 |
| 2006/0183644 A1 * | 8/2006 | Nakamura et al. ............. 505/210 |
| 2009/0317617 A1 | 12/2009 | Sato et al. |
| 2010/0151231 A1 | 6/2010 | Matsuo et al. |
| 2010/0323192 A1 | 12/2010 | Matsuo et al. |
| 2010/0323193 A1 | 12/2010 | Matsuo et al. |

FOREIGN PATENT DOCUMENTS

| JP | 11-142752 | 5/1999 |
| JP | 2008-116669 | 5/2008 |
| JP | 2009-134028 | 6/2009 |
| JP | 4337935 | 7/2009 |

OTHER PUBLICATIONS

Extended European Search Report dated Jul. 12, 2011 (8 pages).

* cited by examiner

*Primary Examiner* — Stephone Allen
*Assistant Examiner* — Kimberly N Kakalec
(74) *Attorney, Agent, or Firm* — Harness, Dickey & Pierce, P.L.C.

(57) ABSTRACT

A method of manufacturing an optical filter according to the invention includes the steps of forming a first bonding film in a first bonding area of a first substrate provided with a first reflecting film, forming a second bonding film in a second bonding area of a second substrate provided with a second reflecting film, irradiating the first bonding area with ozone or an ultraviolet ray using a first mask member, irradiating the second bonding area with ozone or an ultraviolet ray using a second mask member, and bonding the first bonding film and the second bonding film to each other to bond the first substrate and the second substrate to each other, thereby protecting the reflecting films from ozone or ultraviolet radiation to prevent the reflecting films from being deteriorated in the manufacturing process.

8 Claims, 13 Drawing Sheets

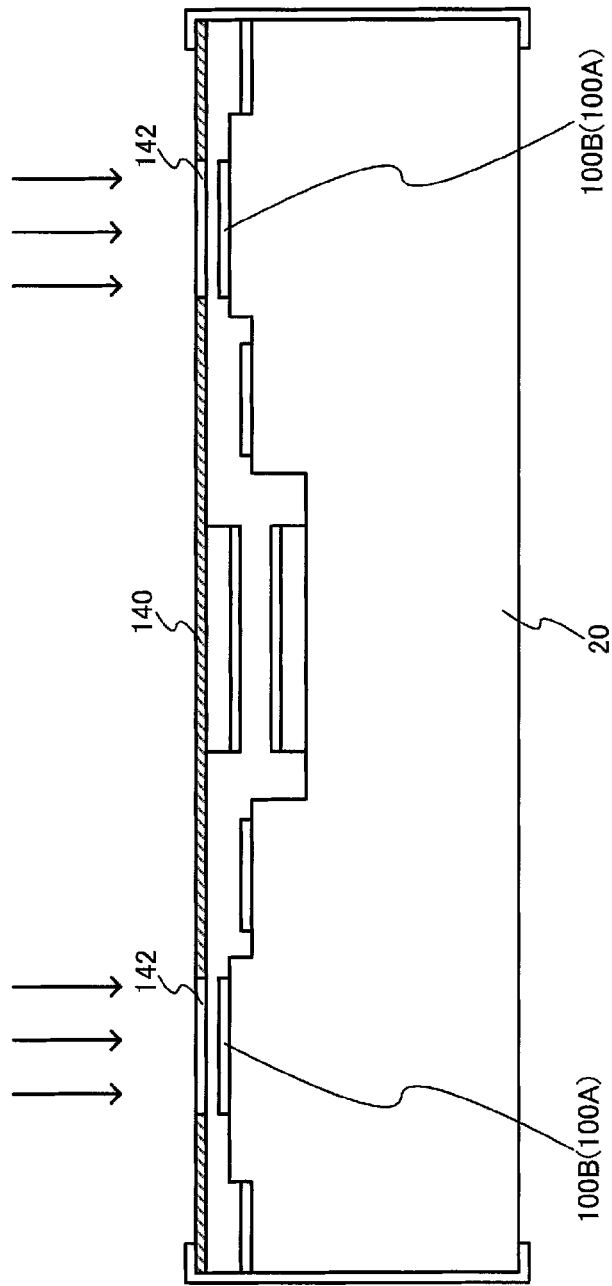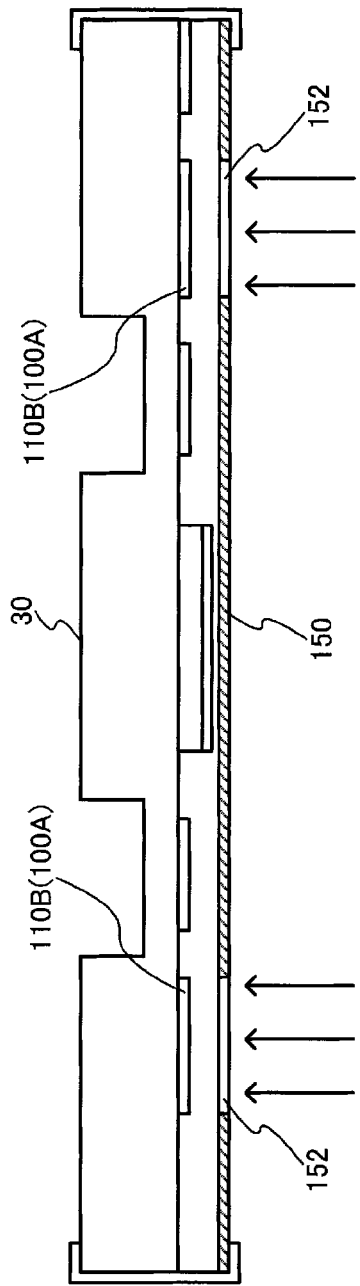
FIG.10
FIG.11

METHOD OF MANUFACTURING OPTICAL FILTER, ANALYTICAL INSTRUMENT, AND OPTICAL APPARATUS

BACKGROUND

1. Technical Field

The present invention relates to a method of manufacturing an optical filter, an analytical instrument, and an optical apparatus.

2. Related Art

There has been proposed a method of bonding two base substances to each other efficiently under low temperature, firmly with high dimensional accuracy, without using an adhesive or solid-state bonding, irrespectively of the material thereof (Japanese Patent No. 4,337,935 (Document 1)). According to this method, the bonding films provided respectively to the two base substances are activated with the activation energy to thereby be bonded to each other.

This bonding method can be used in various types of applications including the interference filter having a variable transmission wavelength as one example (JP-A-11-142752 (Document 2)). As shown in FIG. 1 of Document 2, there are provided a pair of substrates held in parallel to each other, and a pair of reflecting films formed on the pair of substrates so as to be opposed to each other and have a gap with a constant distance therebetween. The light beam entering the gap between the pair of reflecting films is multiply reflected on the same principle as a Fabry-Perot interferometer, and the light component in the wavelength band other than a specific wavelength band is canceled by interference while only the light component in the specific wavelength band is transmitted. By making the gap between the pair of reflecting films variable, the interference filter functions as a band-pass filter, and is called an etalon.

The pair of reflecting films can be formed of, for example, dielectric multilayer films shown in Document 2, or metal films assuring high reflectance.

It is expected that when manufacturing the interference filter according to Document 2 or JP-A-2009-134028 the pair of substrates are bonded to each other using the technology according to Document 1.

Incidentally, in the bonding method according to Document 1, bonding can be performed by activating the bonding film with ozone or ultraviolet radiation. It has turned up that in the activation process of the bonding a pair of reflecting films formed of metal films or dielectric multilayer films might be damaged to be changed in quality or deteriorated, and thus the reflectance thereof might be degraded.

SUMMARY

An advantage of some aspects of the invention is to provide a manufacturing method of an optical filter, an analytical instrument, and an optical apparatus each capable of preventing film members other than the bonding films from being changed in quality or deteriorated due to ozone or ultraviolet radiation in the case of providing the bonding films with the activation energy.

(1) According to an aspect of the invention, there is provided a method of manufacturing an optical filter including: (a) providing a first substrate having a first reflecting film, and a first bonding area disposed in a periphery of the first reflecting film, (b) forming a first barrier film on the first reflecting film, and a first bonding film in the first bonding area, (c) providing a second substrate having a second reflecting film, and a second bonding area disposed in a periphery of the second reflecting film, (d) forming a second barrier film on the second reflecting film, and a second bonding film in the second bonding area, (e) irradiating the first bonding film with one of ozone and an ultraviolet ray via a first mask member, (f) irradiating the second bonding film with one of ozone and an ultraviolet ray via a second mask member, and (g) bonding the first bonding film and the second bonding film to each other to thereby bond the first substrate and the second substrate to each other, wherein in step (e), the first mask member has a first opening section located above the first bonding area, and a part of the first mask member is located above the first reflecting film.

According to this aspect of the invention, in step (e), the first mask member has a first opening section located above the first bonding area, and a part of the first mask member is located above the first reflecting film. Further, the first barrier film is formed on the first reflecting film.

According to these features, the irradiation of ozone or an ultraviolet ray on the first reflecting film can be prevented. Therefore, the alteration or the deterioration of the first reflecting film can be prevented.

Further, the first mask member prevents the irradiation of ozone or an ultraviolet ray on the first barrier film. Thus, the first barrier film can be prevented from being activated. As a result, in the step of bonding the first substrate and the second substrate to each other, the first barrier film can be prevented from being bonded to the second barrier film.

(2) According to another aspect of the invention, in the method of manufacturing an optical filter according to the above aspect of the invention, in step (f), the second mask member has a second opening section located above the second bonding area, and a part of the second mask member is located above the second reflecting film.

According to this configuration, the irradiation of ozone or an ultraviolet ray on the second reflecting film can be prevented. Therefore, the alteration or the deterioration of the second reflecting film can be prevented.

Further, the second mask member prevents the irradiation of ozone or an ultraviolet ray on the second barrier film. Thus, the second barrier film can be prevented from being activated. As a result, in the step of bonding the first substrate and the second substrate to each other, the second barrier film can be prevented from being bonded to the first barrier film.

(3) According to another aspect of the invention, in the method of manufacturing an optical filter according to the above aspect of the invention, the first barrier film and the first bonding film are formed in the same process, and the second barrier film and the second bonding film are formed in the same process.

Thus, since the process for depositing the first barrier film and the deposition process of the first bonding film are performed as the same process, it is not required to additionally provide the process for depositing the first barrier film. Further, since the process for depositing the second barrier film and the deposition process of the second bonding film are performed as the same process, it is not required to additionally provide the process for depositing the second barrier film. Therefore, the optical filter can efficiently be manufactured.

(4) According to another aspect of the invention, in the method of manufacturing an optical filter according to the above aspect of the invention, a material of the first barrier film and a material of the first bonding film are different from each other, and a material of the second barrier film and a material of the second bonding film are different from each other.

(5) According to another aspect of the invention, in the method of manufacturing an optical filter according to the above aspect of the invention, in step (e), the first mask member is separate from the first barrier film, and in step (f), the second mask member is separate from the second barrier film. Thus, since the first mask member and the first barrier film can be prevented from having contact with each other, the damage of the first barrier film due to the contact can be prevented. Further, since the second mask member and the second barrier film can be prevented from having contact with each other, the damage of the second barrier film due to the contact can be prevented.

(6) According to another aspect of the invention, in the method of manufacturing an optical filter according to the above aspect of the invention, in step (b), the first bonding film includes an Si skeleton having a siloxane bond, and an elimination group connected to the Si skeleton, in step (d), the second bonding film includes an Si skeleton having a siloxane bond, and an elimination group connected to the Si skeleton, the elimination group is eliminated from the Si skeleton of the first bonding film to thereby form a dangling bond by step (e), the elimination group is eliminated from the Si skeleton of the second bonding film to thereby form a dangling bond by step (f), and in step (g), the dangling bond of the first bonding film and the dangling bond of the second bonding film are bonded to each other to thereby bond the first bonding film and the second bonding film to each other.

According to these features, the dangling bonds are bonded to each other, thereby solidly bonding the first and second substrates to each other.

(7) According to another aspect of the invention, in the method of manufacturing an optical filter according to the above aspect of the invention, in step (a), the first substrate is provided with a first electrode formed in an area between the first reflecting film and the first bonding area, and in step (c), the second substrate is provided with a second electrode formed in an area between the second reflecting film and the second bonding area.

(8) An analytical instrument according to another aspect of the invention includes an optical filter manufactured by the method of manufacturing an optical filter according to the above aspects of the invention.

(9) An optical apparatus according to another aspect of the invention includes an optical filter manufactured by the method of manufacturing an optical filter according to the above aspects of the invention.

BRIEF DESCRIPTION OF THE DRAWINGS

The invention will be described with reference to the accompanying drawings, wherein like numbers reference like elements.

FIG. 10 is a diagram showing a process of providing the activation energy to the first bonding film not activated.

FIG. 11 is a diagram showing a process of providing the activation energy to the second bonding film not activated.

DESCRIPTION OF EXEMPLARY EMBODIMENTS

Hereinafter, some preferred embodiments of the invention will be described in detail. It should be noted that the present embodiments explained below do not unreasonably limit the content of the invention as set forth in the appended claims, and all of the constituents set forth in the present embodiments are not necessarily essential as means of the invention for solving the problems.

1. Bonded Member and Manufacturing Method Thereof

Figure 1A:
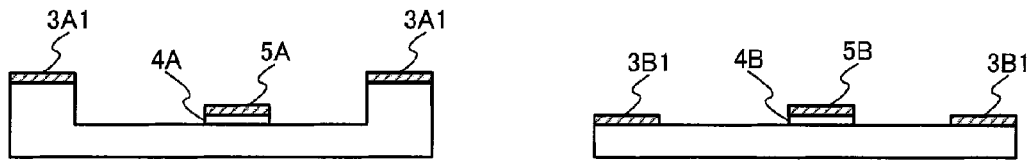
FIGS. 1A through 1D are diagrams showing a method of manufacturing a bonded member according to an embodiment of the invention.
Figure 1B:
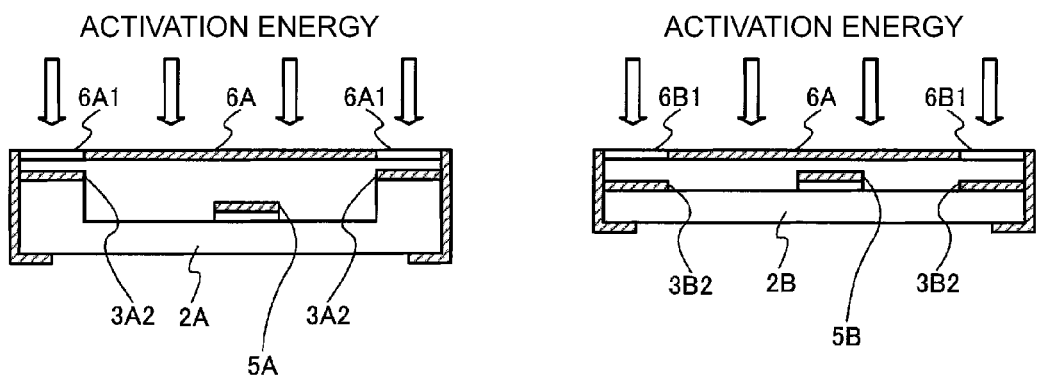
Figure 1C:
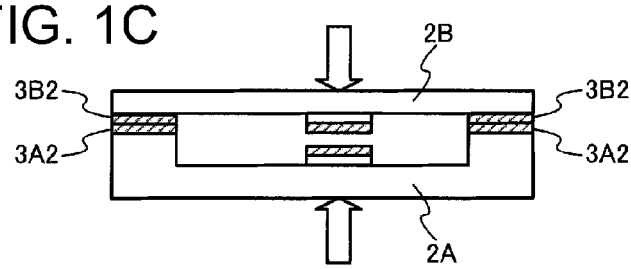
Figure 1D:
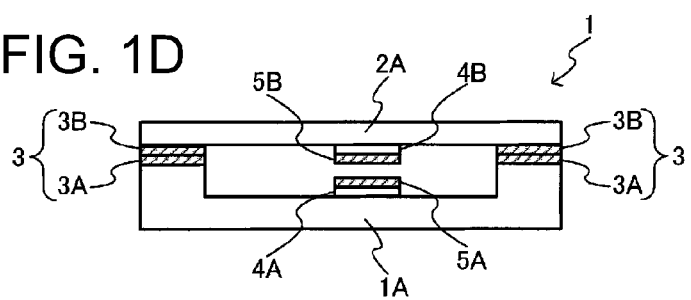

FIGS. 1A through 1D show the manufacturing method of a bonded member 1. As shown in FIG. 1D, the bonded member 1 has at least a first base substance 2A, a second base substance 2B opposed to the first base substance 2A, a first bonding film 3A provided to the first base substance 2A, a second bonding film 3B provided to the second base substance 2B, a first film member 4A provided to the first base substance 2A, and a first barrier film 5A covering the surface of the first film member 4A. In FIG. 1D, the second film member 4B provided to the second base substance 2B and the second barrier film 5B covering the surface of the second film member 4B are provided. The first and second base substances 2A, 2B are bonded to each other by the first and second bonding films 3A, 3B bonded to each other. The first and second bonding films 3A, 3B bonded to each other forms a bonding film 3.

It should be noted that the second film member 4B and the second barrier film 5B are not necessarily required. Further, even in the case of providing the second film member 4B and the second barrier film 5B, the positional relationship between these components and the first film member 4A and the first barrier film 5A is not necessarily required to be the "facing" relationship as shown in FIG. 1D, but is no object.

The positional relationship between the first bonding film 3A and the first film member 4A is also no object. In particular, in the case, for example, in which the supply directions of the activation energy in the activation energy provision process described later are all directions, it is not necessarily required to form the first bonding film 3A and the first film member 4A on the same side of the first base substance 2A. Therefore, the first bonding film 3A is not limited to what is formed on the stepped surface having a height different from the height of the bonding surface of the first base substance 2A provided with the first film member 4A as shown in FIG. 1D, but can also be formed on the surface coplanar with the bonding surface or the reverse surface opposed to the bonding surface. The same can be applied to the positional relationship between the second bonding film 3B and the second film member 4B.

Firstly, as shown in FIG. 1A, the first base substance 2A provided with the first bonding film 3A1, the first film member 4A, and the first barrier film 5A, and the second base substance 2B provided with the second bonding film 3B1, the second film member 4B, and the second barrier film 5B are separately manufactured. Here, the first bonding film 3A1 and the second bonding film 3B1 express the inactive film state in which the activation energy provision process shown in FIG. 1B has not been performed. The first bonding film 3A1 not yet activated and the first barrier film 5A are formed simultaneously using the same material. Similarly, the second bonding film 3B1 not yet activated and the second barrier film 5B are formed simultaneously using the same material. The first bonding film 3A1 not yet activated and the first barrier film 5A can also be formed using respective materials different from each other. Similarly, the second bonding film 3B1 not yet activated and the second barrier film 5B can also be formed using respective materials different from each other.

Subsequently, as shown in FIG. 1B, the first and second bonding films 3A1, 3B1 not yet activated are each provided with the activation energy in at least a part of the area thereof in a plan view, namely in the entire area or a part of the area of each of the first and second bonding films 3A1, 3B1 in a plan view, by ozone or ultraviolet radiation. Thus, the first and second bonding films 3A1, 3B1 are activated to be turned into the first and second bonding films 3A2, 3B2 having been activated in which the adhesiveness thereof is developed. On this occasion, a first mask member 6A prevents the ozone or the ultraviolet radiation from entering the surface of the first barrier film 5A to thereby keep the first barrier film 5A in the inactive state. Since the first mask member 6A has an opening 6A1, the first bonding film 3A1 is provided with the activation energy.

Similarly, a second mask member 6B prevents the ozone or the ultraviolet radiation from entering the surface of the second barrier film 5B to thereby keep the second barrier film 5B in the inactive state. Since the second mask member 6B has an opening 6B1, the second bonding film 3B1 is provided with the activation energy.

Subsequently, as shown in FIG. 1C, the first and second base substances 2A2, 2B2 having been activated are made to face each other, and then the first and second bonding films 3A2, 3B2 expressing the adhesiveness due to the activation are bonded to each other while making at least weight act on the first and second base substances 2A2, 2B2. Thus, the bonded member 1 shown in FIG. 1D is manufactured.

Here, the first base substance 2A can be made of any material providing rigidity so high as to support the first bonding film 3A, the first film member 4A, and the first barrier film 5A. The same can be applied to the second base substance 2B.

Specifically, as the constituent material of the first and second base substances 2A, 2B, there can be cited polyolefin such as polyethylene, polypropylene, ethylene-propylene copolymer, or ethylene-vinyl acetate copolymer (EVA), cyclic polyolefin, modified polyolefin, polyvinyl chloride, polyvinylidene chloride, polystyrene, polyamide, polyimide, polyamideimide, polycarbonate, poly-(4-methylpentene-1), ionomer, acrylic resin, polymethylmethacrylate, acrylonitrile-butadiene-styrene copolymer (ABS resin), acrylonitrile-styrene copolymer (AS resin), butadiene-styrene copolymer, polyoxymethylene, polyvinyl alcohol (PVA), ethylene-vinyl alcohol copolymer (EVOH), polyester such as polyethylene terephthalate (PET), polyethylene naphthalate, polybutylene terephthalate (PBT), or polycyclohexane terephthalate (PCT), polyether, polyetherketone (PEK), polyether ether ketone (PEEK), polyetherimide, polyacetal (POM), polyphenylene oxide, modified polyphenylene oxide, polysulfone, polyethersulfone, polyphenylene sulfide, polyarylate, aromatic polyester (liquid crystal polymer), fluorinated resin such as polytetrafluoroethylene, or polyvinylidene fluoride, various types of thermoplastic elastomers such as styrene series, polyolefin series, polyvinyl chloride series, polyurethane series, polyester series, polyamide series, polybutadiene series, trans-polyisoprene series, fluoro-rubber series, and chlorinated polyethylene series, resin materials such as epoxy resin, phenol resin, urea resin, melamine resin, aramid resin, unsaturated polyester resin, silicone resin, polyurethane resin, and so on, copolymers, polymer blends, and polymer alloys having any one of these compounds as the primary constituent, metals such as Fe, Ni, Co, Cr, Mn, Zn, Pt, Au, Ag, Cu, Pd, Al, W, Ti, V, Mo, Nb, Zr, Pr, Nd, and Sm, and alloys including any of these metals, metal materials such as carbon steel, stainless steel, indium tin oxide (ITO), and gallium arsenic, silicon materials such as single crystal silicon, polycrystalline silicon, and amorphous silicon, glass materials such as silicate glass (quartz glass), alkaline silicate glass, soda-lime glass, potash-lime glass, lead (alkaline) glass, barium glass, and borosilicate glass, ceramics materials such as alumina, zirconia, ferrite, silicon nitride, aluminum nitride, boron nitride, titanium nitride, silicon carbide, boron carbide, titanium carbide, tungsten carbide, carbon-based material such as graphite, and composite materials obtained by combining one or more of these materials.

Further, the first and second base substances 2A, 2B can have the surface to which a plating process such as Ni plating, a passivation treatment such as a chromate treatment, or a nitriding treatment is applied. Further, it should be noted that the shapes of the first and second base substances 2A, 2B are not limited to the plate-like shape. In other words, the shapes of the first and second base substances 2A, 2B can be, for example, a block-like shape or a rod-like shape.

It should be noted that in the present embodiment, if at least one of the first and second base substances 2A, 2B, for example, the second base substance 2A has the plate-like shape, the second base substance 2B becomes easy to bend, and sufficiently deformable along the shape of the first base substance 2A, and therefore, the adhesiveness between the first and second base substances is enhanced. Further, since the adhesiveness between the first base substance 2A and the first bonding film 3A is enhanced, and the second base substance 2B bends, the stress caused in the bonding interface can be eased to some extent.

In this case, the average thickness of the first base substance 2A is not particularly limited, but is preferably in a range of 0.01 through 10 mm, and is further preferably in a range of 0.1 through 3 mm in order for ensuring the flexibility. It should be noted that the average thickness of the second base substance 2B is also preferably in substantially the same range as the average thickness of the first base substance 2A.

Figure 2:
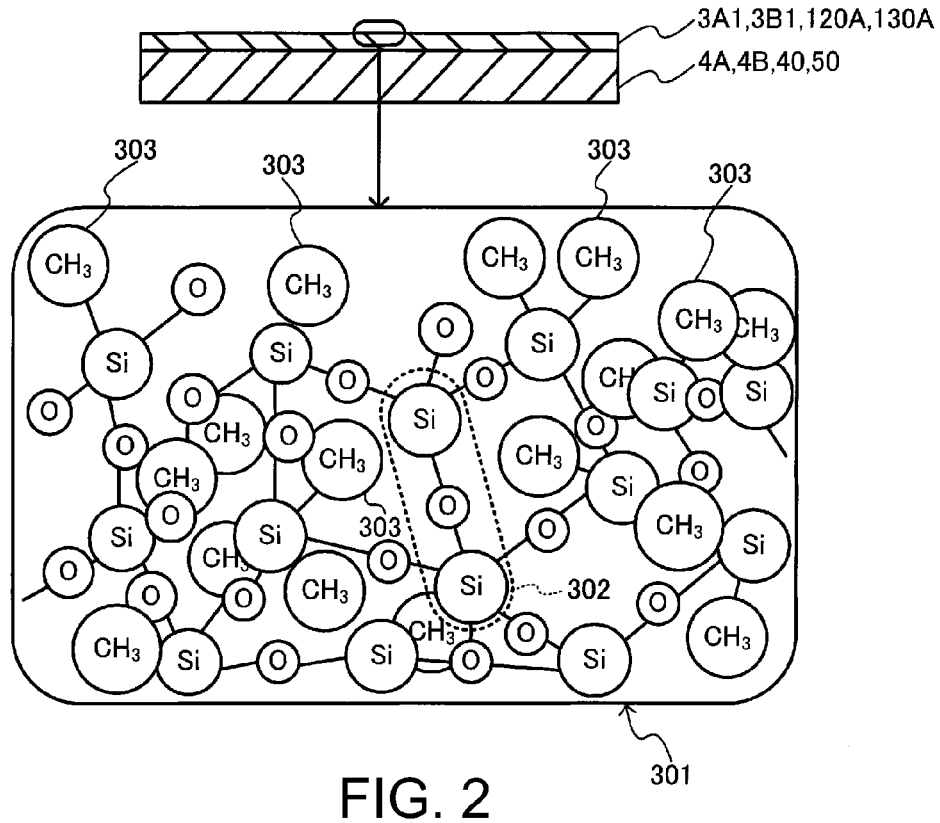
FIG. 2 is a schematic diagram schematically showing the structure of a plasma-polymerized film (corresponding to each of first and second film members, first and second barrier films) not provided with the activation energy.

The first and second bonding films 3A, 3B not yet activated shown in FIG. 1D can be provided with an Si skeleton 301 including the siloxane (Si—O—SiO) bonds 302, and the elimination groups 303 to be bonded to the Si skeleton 301 as shown in FIG. 2, for example. In the first and second bonding films 3A2, 3B2 having been activated shown in FIGS. 1B and 1C, the elimination groups 303 having been bonded to the Si skeleton 301 are eliminated to form active hands 304 shown in FIG. 3. It should be noted that the active hands 304 include bonds (hereinafter also referred to as "dangling bonds") not terminated and those obtained by terminating the dangling bonds with hydroxyl groups (OH groups) in the Si skeleton 301. The dangling bonds out of the active hands 304 of the first bonding film 3A2 and the dangling bonds out of the active hands 304 of the second bonding film 3B2 are bonded to each other, thereby bonding the first and second bonding films 3A2, 3B2 to each other.

Further, on at least the area of the first base substance 2A in which the first bonding film 3B1 should be formed, it is preferable to previously perform the surface treatment for enhancing the adhesiveness between the first base substance 2A and the first bonding film 3A1 in accordance with the constituent material of the first base substance 2A prior to forming the first bonding film 3A1.

As such a surface treatment, there can be cited, for example, a physical surface treatment such as a sputtering process or a blast process, a chemical surface treatment such as a plasma process using the oxygen plasma, nitrogen plasma, and so on, a corona discharge process, an etching process, an electron beam irradiation process, an ultraviolet irradiation process, or an ozone exposure process, or the treatment of combining these treatments. By performing the treatment described above, it becomes possible to clean the area in which the first bonding film 3A of the first base substance 2A should be formed, and at the same time to activate the area. Thus, the bonding strength between the first base substance 2A and the first bonding film 3A1 can be enhanced. The bonding strength between the second base substance 2B and the second bonding film 3B1 can also be enhanced in substantially the same manner.

The first and second film members 4A, 4B have a film quality altered or deteriorated by ozone or ultraviolet radiation. As an action of the alteration or the deterioration of the first and second film members 4A, 4B, there can be cited oxidation, sulfuration, nitriding, and so on.

One of representative examples of the film of this type is a metal film. Metal films might be oxidized in some cases by ozone in the ozone atmosphere or the ozone obtained by ozonizing the oxygen by ultraviolet radiation. Further, in some cases, the gas in the atmosphere or the first and second film members 4A, 4B themselves are activated by the ultraviolet radiation, and the first and second film members 4A, 4B might be sulfurized by hydrogen sulfide $H_2S$ or the like in the atmosphere, or nitrided by nitrogen oxide $NO_x$ in the atmosphere. Further, when the metal films are irradiated with the ultraviolet ray, the metal atoms are ionized, and become easy to oxidize, sulfurize, or nitride due to the photoelectric effect.

In the case in which the first and second film members 4A, 4B are made of a metal oxide, there is a possibility that the metal oxide is damaged physically or excessively oxidized to thereby be altered in film quality although the metal oxide is originally hard to react with oxygen.

The first and second film members 4A, 4B are not limited thereto, but are enough to be films having a film quality, which is altered or deteriorated by ozone or ultraviolet radiation.

The first and second barrier films 5A, 5B are made of a material having the transmittance of ozone or ultraviolet radiation lower than that of the first and second film members 4A, 4B. The first and second barrier films 5A, 5B can be formed simultaneously with the first and second bonding films 3A1, 3B1 using the same material. As shown in FIG. 2, on this occasion, the first and second barrier films 5A, 5B can be provided with an Si skeleton 301 including the siloxane (Si—O—SiO) bonds 302, and the elimination groups 303 to be bonded to the Si skeleton 301. Since the first and second barrier films 5A, 5B are not activated, the elimination groups 303 remain uneliminated.

The first and second mask members 6A, 6B for preventing the first and second barrier films 5A, 5B from being activated are made of a material having a lower transmittance of ozone or ultraviolet radiation. Although the first and second mask members 6A, 6B can be formed directly on the first and second film members 4A, 4B by deposition so as to adhere thereon, the first and second mask members 6A, 6B need to be removed later depending on the function of the first and second film members 4A, 4B. If it is difficult to remove (e.g., by etching) the first and second mask members 6A, 6B without activating the first and second barrier films 5A, 5B after the activation energy provision process, it is more preferable not to form the first and second mask members 6A, 6B directly on the first and second film members 4A, 4B by deposition so as to adhere thereon. In such a case, it is preferable to removably attach the first and second mask members 6A, 6B to the first and second base substances 2A, 2B using a method such as adhesive bonding.

Figure 4:
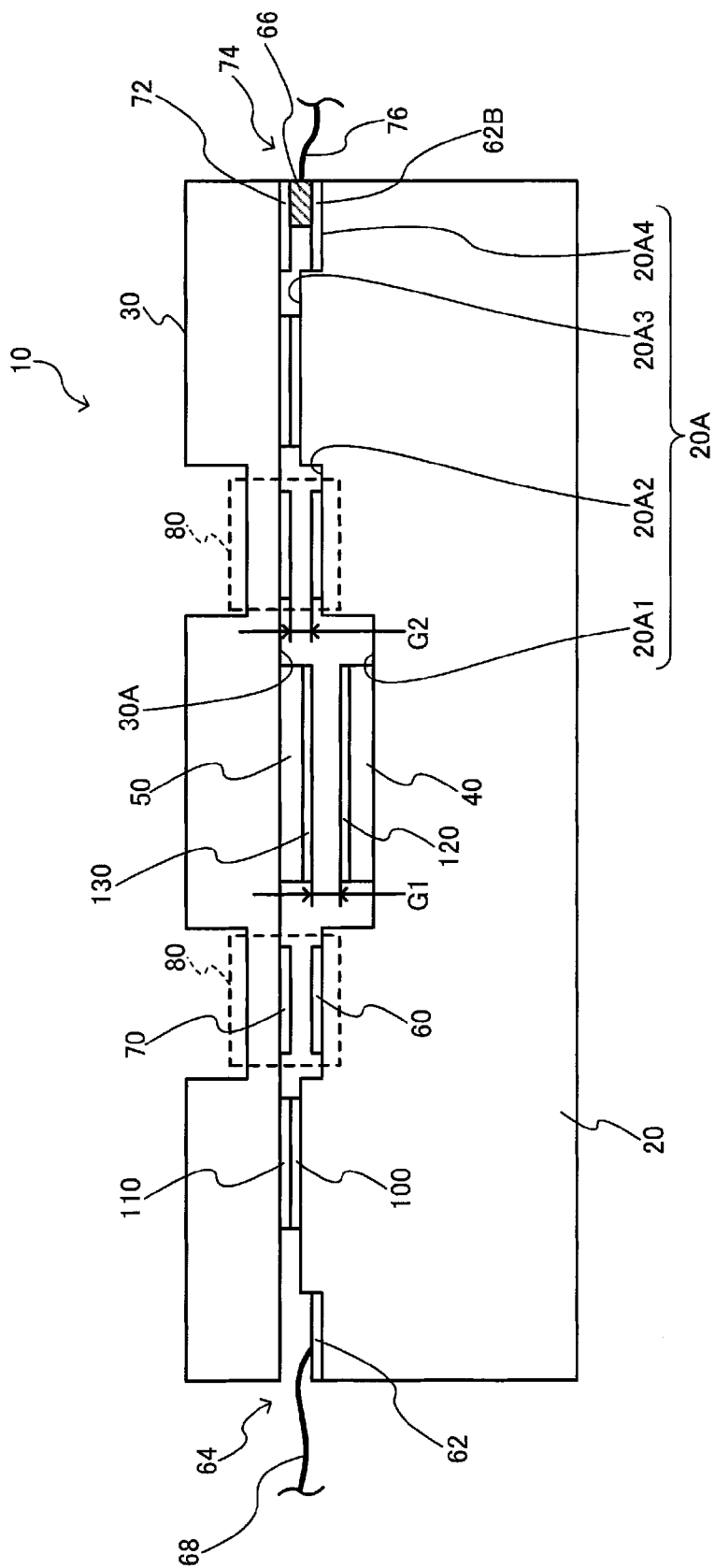
FIG. 4 is a vertical cross-sectional view of an overall optical filter according to an embodiment of the invention.
Figure 5:
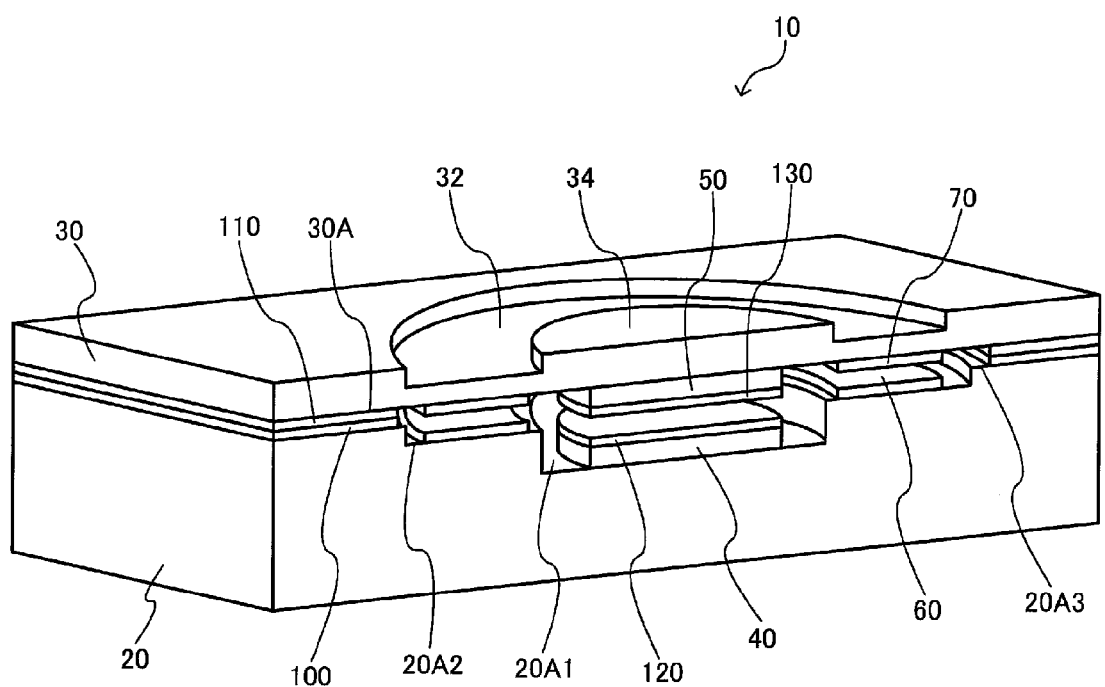
FIG. 5 is a schematic perspective view of the optical filer shown in FIG. 4 with a part thereof cut.

2. Application to Optical Filter 2.1. General Description of Optical Filter Structure FIG. 4 is a vertical cross-sectional view of the whole of an optical filter 10 according to the present embodiment as the bonded member according to the invention, and FIG. 5 is a schematic perspective view of the optical filter 10 with a part thereof cut. The optical filter 10 shown in FIGS. 4 and 5 includes a first substrate (the first base substance in a broader sense) 20 and a second substrate (the second base substance in a broader sense) 30 opposed to the first substrate 20. Although in the present embodiment it is assumed that the first substrate 20 is a fixed substrate or base substrate, and the second substrate 30 is a movable substrate or diaphragm substrate, it is sufficient that either one or both of the substrates are movable.

The first and second substrates 20, 30 are each made of various types of glass such as soda glass, crystalline glass, quartz glass, lead glass, potassium glass, borosilicate glass, or alkali-free glass, a quartz crystal, or the like. In the present embodiment, the constituent material of each of the substrates 20, 30 is synthetic silica glass. Each of the first and second substrates 20, 30 is formed to have a square shape, for example 10 mm on a side, and the greatest diameter of the portion functioning as a circular diaphragm is, for example, 5 mm.

The first substrate 20 has an opposed surface 20A opposed to the second substrate 30, and the second substrate 30 has an opposed surface 30A opposed to the first substrate 20. In the present embodiment, the opposed surface 20A is provided with, for example, first through fourth opposed surfaces 20A1 through 20A4 having respective heights different from each other, while the opposed surface 30A is formed as a flat surface.

There are formed a first reflecting film (the first film member in a broader sense) 40 on the first opposed surface 20A1 of the first substrate 20, a first electrode 60 on the second opposed substrate 20A2, a first bonding film 100 on the third opposed surface 20A3, and a first wiring layer 62 on the fourth opposed surface 20A4, respectively. On the opposed surface 30A of the second substrate 30 there are formed a second reflecting film (the second film member in a broader sense) 50 opposed to the first reflecting film 40, a second electrode 70 opposed to the first electrode 60, a second bonding film 110 opposed to the first bonding film 100, and the second wiring layer 72 opposed to a relay wiring layer 62B. Further, a first barrier film 120 is formed on a surface of the first reflecting film 40, and a second barrier film 130 is formed on a surface of the second reflecting film 50. It should be noted that the first barrier film 120 can also be formed on a film other than the first reflecting film 40. Similarly, the second barrier film 130 can also be formed on a film other than the second reflecting film 50.

It should be noted that as shown in FIG. 4, in the outer peripheral portions of the first and second substrates 20, 30, there are formed a first electrode lead-out section 64 for connecting the first electrode 60 to an external device, and a second electrode lead-out section 74 for connecting the second electrode to an external device. In the first electrode lead-out section 64, the first wiring layer 62 electrically connected to the first electrode 60 is connected to a first lead wire 68. In the second electrode lead-out section 74, the second wiring layer 72 provided to the second substrate 30 is electrically connected to the relay wiring layer 62B on the side of the first substrate 20 via a conductive member 66 such as solder, and a second lead wire 76 is connected to the relay wiring layer 62B.

The first substrate 20 as the base substrate is formed to have the first through fourth opposed surfaces 20A1 through 20A4 by etching a glass substrate formed to have a thickness of, for example, 500 μm. The first substrate 20 is provided with the first reflecting film 40 having, for example, a circular shape formed on a first opposed surface 20A1 located at a central portion out of the opposed surface 20A opposed to the second substrate 30. The second substrate 30 is provided with a diaphragm section 32 formed to have a small wall-thickness and, for example, a ring-like shape, and is further provided with a reflecting film support section 34 having a larger wall-thickness formed at a central portion thereof as shown in FIG. 5 by etching a glass substrate formed to have a thickness of, for example, 200 μm. The second substrate 30 is provided with a second reflecting film 50 having, for example, a circular shape, and opposed to the first reflecting film 40, formed on the opposed surface 30A opposed to the first substrate 20 at a position of the reflecting film support section 34.

The first and second reflecting films 40, 50 are each formed to have, for example, a circular shape with a diameter of about 3 mm. The first and second reflecting films 40, 50 are formed to have the same thickness using the same material. The first and second reflecting films 40, 50 are each deposited by a sputtering method or an evaporation method using a material such as Ag, Al, $SiO_2$, $TiO_2$, or $Ta_2O_5$ as a single layer or a stacked layer, and are each formed to have a metal layer made of Ag, Al, or the like as the outermost surface. It is also possible to form each of the first and second reflecting films 40, 50 as a single layer, and it is also possible to form it as a dielectric multilayer film obtained by alternately stacking, for example, $TiO_2$ and $SiO_2$.

Further, it is possible to form antireflection films (AR) not shown on the respective surfaces of the first and second substrates 20, 30 on the opposite side to the opposed surfaces 20A1, 20A2, and 30A thereof at positions corresponding to the first and second reflecting films 40, 50. The antireflection films are each formed by alternately stacking low refractive index films and high refractive index films, and decrease the reflectance to the visible light on the interfaces of the first and second substrates 20, 30 while increasing the transmittance thereof.

The first and second reflecting films 40, 50 respectively provided with the first and second barrier films 120, 130 are disposed so as to be opposed to each other via a first gap G1 shown in FIG. 4. It should be noted that although in the present embodiment a fixed mirror is used as the first reflecting film 40 and a movable mirror is used as the second reflecting film 50, it is possible to make either one or both of the first and second reflecting films 40, 50 movable in accordance with the configuration of the first and second substrates 20, 30 described above.

The second opposed surface 20A2, which is located on the periphery of the first reflecting film 40 and on the periphery of the first opposed surface 20A1 of the first substrate 20 in the plan view, is provided with the first electrode 60. Similarly, the opposed surface 30A of the second substrate 30 is provided with the second electrode 70 so as to be opposed to the first electrode 60. The first electrode 60 and the second electrode 70 are each formed to have, for example, a ring-like shape as shown in FIG. 5, and are arranged so as to be opposed to each other via a second gap G2 shown in FIG. 4. It should be noted that each of the surfaces of the first and second electrodes 60, 70 can be covered by an insulating film.

In the present embodiment, the opposed surface 20A of the first substrate 20 has the first opposed surface 20A1 provided with the first reflecting film 40, and the second opposed surface 20A2, which is arranged on the periphery of the first opposed surface 20A1 in a plan view, and is provided with the first electrode 60. Although the first opposed surface 20A1 and the second opposed surface 20A2 can be coplanar with each other, in the present embodiment there is a step between the first opposed surface 20A1 and the second opposed surface 20A2, and the second opposed surface 20A2 is placed nearer to the second substrate 30 than the first opposed surface 20A1. Thus, the relationship of (first gap G1)>(second gap G2) becomes true. This is not a limitation, but the relationship of (first gap G1)<(second gap G2) can also be adopted.

The first and second electrodes 60, 70 are formed to have the same thickness using the same material. In the present embodiment, the first and second electrodes 60, 70 are each deposited by a sputtering method to have a thickness of, for example, about 0.1 μm using light transmissive indium tin oxide (ITO) doped with tin oxide as an impurity. Therefore, it results that the gap of the actuator section is determined in accordance with the depth of a recessed section, the thickness of the electrodes, and the thickness of the bonding films. Here, the material of the electrodes is not limited to ITO, but can be metal such as gold. However, in the present embodiment ITO is used for the reason that whether or not discharge occurs is easily checked because of the transparency thereof.

Here, the pair of electrodes, namely the first and second electrodes 60, 70, function as a gap variable drive section 80 for varying the dimension of the first gap G1 between the first and second reflecting films 40, 50. The gap variable drive section 80 of the present embodiment is an electrostatic actuator. The electrostatic actuator 80 is provided with an electrical potential difference between the first and second electrodes 60, 70 as the pair of electrodes to cause electrostatic attractive force for varying the dimension of the second gap G2 between the first and second electrodes 60, 70 as the pair of electrodes, and thus moving the second substrate 30 relatively to the first substrate 20, thereby varying the dimension of the first gap G1 between the first and second reflecting films 40, 50. It should be noted that the gap variable drive section 80 is not limited to the electrostatic actuator, but can be replaced with a piezoelectric element or the like.

2.2. Bonding Films and Barrier Films

The third opposed surface 20A3, which is located on the periphery of the first electrode 60 and on the periphery of the second opposed surface 20A2 of the first substrate 20 in the plan view, is provided with the first bonding film 100. Similarly, the opposed surface 30A of the second substrate 30 is provided with the second bonding film 110 so as to be opposed to the first bonding film 100.

The first barrier film 120 is formed to cover the surface of the first reflecting film 40, using a material having the transmission of ozone or ultraviolet radiation lower than that of the first reflecting film 40. The second barrier film 130 is formed to cover the surface of the second reflecting film 50, using a material having the transmission of ozone or ultraviolet radiation lower than that of the second reflecting film 50.

Here, the first and second bonding films 100, 110 can be bonded to each other after the activation energy is provided by ozone or ultraviolet irradiation. Moreover, the first barrier film 120 can be formed prior to providing the activation energy at least to the first bonding film 100, and the second barrier film 130 can be formed prior to providing the activation energy at least to the second bonding film 110. According to this process, it is possible to prevent ozone or an ultraviolet ray from entering the first reflecting film 40 or the second reflecting film 50 when providing the activation energy to the first bonding film 100 or the second bonding film 110 by ozone or ultraviolet irradiation. As described above, the first and second reflecting films 40, 50 can be prevented from being reduced in reflectance due to the change in quality or deterioration caused by being exposed to ozone or ultraviolet radiation.

In some cases, the first and second reflecting films 40, 50 are formed using a metal film such as an Ag film or an Al film as a particularly high reflectance film. These metal films have low environmental resistances, and might be altered to metal oxide films by, for example, being exposed to ozone of oxygen plasma or to ozone generated by ultraviolet irradiation. Further, when the metal films are irradiated with the ultraviolet ray, the metal atoms are ionized, and become easy to oxidize or sulfurize due to the photoelectric effect. Incidentally, even if dielectric multilayer films are used as the first and second reflecting films 40, 50, there is a possibility that the dielectric multilayer films are damaged physically or excessively oxidized to thereby be altered in film quality although the dielectric multilayer films are composed of metal oxide films or the like, and are originally hard to react with oxygen. In the present embodiment, such alternation and deterioration of the first and second reflecting films 40, 50 as described above can be prevented using the first and second barrier films 120, 130.

It should be noted that the formation timing of the first and second barrier films 120, 130 is not necessarily limited to the period prior to the activation energy provision process. This is because the first and second reflecting films can be protected from ozone and ultraviolet radiation even in the case in which the optical filter 10 is incorporated in an apparatus using an ultraviolet ray. From the viewpoint of protecting the first and second reflecting films 40, 50 for a long period of time taking the actual use of the optical filter 10 into consideration as described above, the first and second barrier films 120, 130 preferably have film characteristics high in the environmental resistance in addition to the ozone resistance or the ultraviolet resistance. In particular, the first and second barrier films 120, 130 are preferably provided with other properties such as low reactivity (sulfurization property) with hydrogen sulfide ($H_2S$) or the like, low reactivity (halogenation property) with halogen series, or a high moisture resistance in view of the reliability as a commercial product in comparison with the first and second reflecting films 40, 50.

Here, the first and second bonding films 100, 110 can be formed as plasma-polymerized films deposited by a plasma polymerization method. On this occasion, the first and second barrier films 120, 130 can be formed as plasma-polymerized films formed in the same process with the first and second bonding films 100, 110. According to this procedure, the deposition process for the first and second barrier films 120, 130 can also be used as the deposition process for the first and second bonding films 100, 110, and no additional manufacturing process is required. Therefore, cost reduction of the optical filter 10 can be maintained. Further, the first barrier film 120 can also be formed using a material different from the material of the first bonding film 100. Similarly, the second barrier film 130 can also be formed using a material different from the material of the second bonding film 110. Each of the first and second bonding films 100, 110, and the first and second barrier films 120, 130 can include the Si skeleton having siloxane bonds (Si—O—Si) and elimination groups bonded to the Si skeleton in the plasma polymerization.

FIG. 2 schematically shows the structure of such a plasma-polymerized film. In particular, FIG. 2 shows the structure of the first and second barrier films 120, 130 formed of the plasma-polymerized films, which is the same as the structure of the first and second bonding films 100, 110 not yet provided with the activation energy and formed of the plasma-polymerized films. Therefore, although the explanation will hereinafter be presented with reference to FIG. 2 assuming the first and second barrier films 120, 130, the explanation can also be applied to the first and second bonding films 100A, 110A (see FIGS. 7C and 9D described later) corresponding to the first and second bonding films 100, 110 not yet provided with the activation energy.

Figure 3:
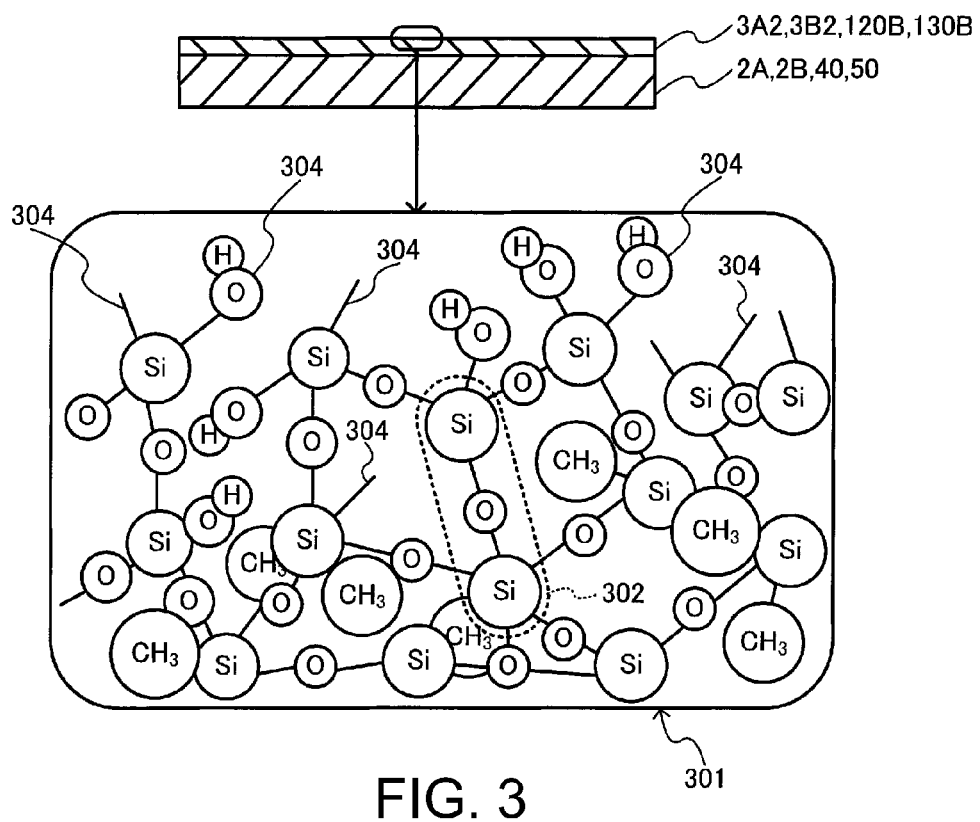
FIG. 3 is a schematic diagram schematically showing the structure of a plasma-polymerized film provided with the activation energy.

Further, FIG. 3 shows a structure of the first and second bonding films 100B, 110B (see FIG. 10 described later) obtained by activating the first and second bonding films 100A, 110A with the activation energy, the first and second bonding films 100A, 110A not having been provided with the activation energy and having the structure shown in FIG. 2.

The first and second barrier films 120, 130 shown in FIG. 2 described above, and the first and second bonding films 100B, 110B having been activated shown in FIG. 2 described above each include the siloxane bonds (Si—O—Si) 302, and have the Si skeleton 301 with, for example, a random atomic arrangement. The first and second barrier films 120, 130 and the first and second bonding films 100, 110 shown in FIG. 2 each have the elimination groups 303 to be bonded to the Si skeleton 301. In contrast, the first and second bonding films 100B, 110B having been activated shown in FIG. 3 each have active hands 304 formed by eliminating the elimination groups 303 from the Si skeleton 301.

The first and second barrier films 120, 130 and the first and second bonding films 100B, 110B having been activated each become a solid film hard to be deformed under the influence of the Si skeleton 301 including the siloxane bonds 302 and having a random atomic arrangement. It is conceivable that this is because a defect such as dislocation or shift in the grain boundary is hardly generated since the crystallinity of the Si skeleton 301 is reduced. Therefore, the film itself becomes to have high bonding strength, high chemical resistance, and high dimensional accuracy, and in the first and second bonding films 100, 110 and the first and second barrier films 120, 130 obtained finally, those having high chemical resistance and high dimensional accuracy can be obtained, and in the first and second barrier films 120, 130 high bonding strength can be obtained.

The characteristics of the first and second barrier films 120, 130 described above can also be explained from the structure having the Si skeleton 301 including the siloxane bonds (Si—O—Si) 302, and the elimination groups 303 bonded to the Si skeleton 301. Specifically, the passing route of the gas is blocked by the siloxane bonds (Si—O—Si) 302, and thus the high gas-barrier property can be obtained. Further, since the first and second barrier films 120, 130 do not have the dangling bond 304 shown in FIG. 3, the first and second barrier films 120, 130 become to have characteristics of low in reactivity and hard to be oxidized or sulfurized. Further, the siloxane bond (Si—O—Si) 302 absorbs light with a wavelength equal to or shorter than 200 nm including the wavelength band of ultraviolet rays similarly to the case of $SiO_2$. If the first and second barrier films 120, 130 absorb the ultraviolet ray, the first and second barrier films 120, 130 are exited to rise in the energy state, but are not changed in the state because the bond energy of the siloxane bond (Si—O—Si) 302 is greater than the excitation energy due to the ultraviolet radiation.

When the activation energy is provided to the first and second bonding films 100A, 110A not yet provided with the activation energy having the structure shown in FIG. 2, the elimination groups 303 are eliminated from the Si skeleton 301, and as shown in FIG. 3, the active hands (the dangling bonds) 304 are generated on the surface of or inside the first and second bonding films 100B, 110B thus activated. Thus, an adhesion property is developed on the surfaces of the first and second bonding films 100B, 110B having been activated, and the dangling bonds out of the active hands 304 of the first and second bonding films 100B, 110B are bonded to each other, thereby obtaining the first and second bonding films 100, 110 bonded to each other shown in FIG. 4. The first substrate 20 provided with the first bonding film 100B having been activated becomes capable of being bonded to the second substrate 30, which is provided with the second bonding film 110B having been activated, solidly, efficiently, and with high dimensional accuracy.

The first and second barrier films 120, 130 and the first and second bonding films 100B, 110B having been activated each become a solid member without fluidity. Therefore, the thickness and shape of the film hardly change compared to a liquid or mucous adhesive with fluidity used in the related art. Thus, the dimensional accuracy of the films can be dramatically improved compared to the related art. Further, since the time necessary for curing the adhesive becomes unnecessary, solid bonding can be achieved in a short period of time.

In the first and second barrier films 120, 130 and the first and second bonding films 100, 110, in particular, a sum of the content rate of Si atoms and the content rate of O atoms out of the atoms obtained by eliminating the H atoms from the total atoms constituting the film is preferably in a range of 10 through 90 atomic percent, and more preferably in a range of 20 through 80 atomic percent. If the Si atoms and the O atoms are included at the content rate within this range, in the first and second barrier films 120, 130 and the first and second bonding films 100, 110, the Si atoms and the O atoms form a solid network, and the films themselves become solid. Further, it results that the first and second bonding films 100, 110 can bond the first and second substrates 20, 30 to each other with high bonding strength.

Further, the abundance ratio between the Si atoms and the O atoms in the first and second barrier films 120, 130 and the first and second bonding films 100, 110 is preferably in a range of 3:7 through 7:3, and more preferably in a range of 4:6 through 6:4. By setting the abundance ratio between the Si atoms and the O atoms to fall within this range, the stability of the films can be improved. According also to this arrangement, it results that the first and second bonding films 100, 110 can bond the first and second substrates 20, 30 to each other with high bonding strength.

It should be noted that the crystallinity of the Si skeleton 301 in the first and second barrier films 120, 130 and the first and second bonding films 100, 110 is preferably equal to or lower than 45%, and more preferably equal to or lower than 40%. Thus, the Si skeleton 301 becomes to include sufficiently random atomic arrangement. Therefore, the characteristics of the Si skeleton 301 described above become actualized.

Further, the first and second barrier films 120, 130 and the first and second bonding films 100, 110 preferably include an Si—H bond in the structures thereof. The Si—H bond is generated in the polymeric substance when the polymerization reaction of silane is performed by the plasma polymerization method, and it is conceivable that the Si—H bond hinders the regular generation of the siloxane bond on this occasion. Therefore, it results that the siloxane bond is formed so as to keep off the Si—H bond to thereby degrade the regularity of the atomic arrangement of the Si skeleton 301. In such a manner as described above, according to the plasma polymerization method, the Si skeleton 301 with low crystallinity can efficiently be formed.

On the other hand, it is not necessarily true that the higher the content ratio of the Si—H bond in the first and second barrier films 120, 130 and the first and second bonding films 100, 110 is, the lower the crystallinity becomes. Specifically, assuming that the intensity of the peak attributing to the siloxane bond is 1 in the infrared light absorption spectrum, the intensity of the peak attributing to the Si—H bond is preferably in a range of 0.001 through 0.2, further preferably in a range of 0.002 through 0.05, and still further preferably in a range of 0.005 through 0.02. By setting the ratio of the Si—H bond to the siloxane bond to be within the range described above, the atomic arrangement becomes relatively the most random. Therefore, in the case in which the peak intensity of the Si—H bond exists within this range with respect to the peak intensity of the siloxane bond, the first and second barrier films 120, 130 and the first and second bonding films 100, 110 become particularly superior in chemical resistance and dimensional accuracy, and the first and second bonding films 100, 110 also become superior in bonding strength.

Further, the elimination groups 303 bonded to the Si skeleton 301 are eliminated from the Si skeleton 301 to thereby act so as to generate the active hands in the bonding films 100, 110. Therefore, the elimination group 303 needs to be evenly eliminated with relative ease in response to the provision of the energy but to surely be bonded to the Si skeleton 301 so as not to be eliminated when no energy is provided.

From such a viewpoint, as the elimination group 303 there is preferably used what is constituted with at least one species selected from the group consisting of H atom, B atom, C atom, N atom, O atom, P atom, S atom, and halogen series atom, and an atomic group including either one of these atoms and having these atoms arranged so as to be bonded to the Si skeleton 301. Such an elimination group 303 is relatively superior in selectivity of bond/elimination in accordance with provision of the energy. Therefore, such an elimination group 303 becomes to sufficiently satisfy the requirement described above, and it becomes possible to make the adhesion property of the first and second bonding films 100, 110 further enhanced.

It should be noted that as the atomic group (functional group) having the atoms arranged so as to be bonded to the Si skeleton 301, there can be cited, for example, an alkyl group such as a methyl group or an ethyl group, an alkenyl group such as a vinyl group or an allyl group, an aldehyde group, a ketone group, a carboxyl group, an amino group, an amide group, a nitro group, an alkyl halide group, a mercapto group, a sulfonate group, a cyano group, or an isocyanate group.

Among these groups, the alkyl group is particularly preferable for the elimination group 303. Since the alkyl group has high chemical stability, the first and second barrier films 120, 130 containing the alkyl groups become superior in the barrier property such as an environmental resistance or a chemical resistance.

Here, in the case in which the elimination group 303 is the methyl group (—$CH_3$), the preferable content ratio thereof is defined as follows in accordance with the peak intensity in the infrared light absorption spectrum. Specifically, assuming that the intensity of the peak attributing to the siloxane bond is 1 in the infrared light absorption spectrum, the intensity of the peak attributing to the methyl group is preferably in a range of 0.05 through 0.45, further preferably in a range of 0.1 through 0.4, and still further preferably in a range of 0.2 through 0.3. By setting the ratio of the peak intensity of the methyl group to the peak intensity of the siloxane bond to be within the range described above, the necessary and sufficient number of active hands 304 are generated in the first and second bonding films 100B, 110B having been activated while preventing the methyl groups from unnecessarily hindering the generation of the siloxane bond. Therefore, a sufficient adhesion property is provided to the first and second bonding films 100B, 110B having been activated.

As a constituent material of the first and second barrier films 120, 130 and the first and second bonding films 100, 110 having the characteristics described above, a polymeric material including the siloxane bond such as polyorganosiloxane can be cited. The film constituted with polyorganosiloxane itself has superior mechanical characteristics. Further, it exhibits a particularly superior adhesion property with respect to various types of materials. Therefore, the first and second bonding films 100, 110 constituted with polyorganosiloxane exhibit particularly strong adhesion force, and as a result, are capable of solidly bonding the first and second substrates 20, 30 to each other.

Further, although polyorganosiloxane normally exhibits water repellency (non-adherent property), by providing the activation energy, organic groups can easily be eliminated to change itself to be hydrophilic to thereby develop an adherence property. There is obtained an advantage that the control between the non-adherent property and the adherence property can easily and surely be performed.

It should be noted that the water repellency (the non-adherent property) is an action mainly due to the alkyl groups contained in polyorganosiloxane. Therefore, the first and second bonding films 100A, 110A not yet activated and constituted with polyorganosiloxane also has an advantage of developing an adherence property on the surface thereof, and at the same time, obtaining the action and effect due to the alkyl group described above in the portions other than the surface thereof in response to the provision of the activation energy. Therefore, the first and second barrier films 120, 130 and the first and second bonding films 100, 110 are made superior in environmental resistance and chemical resistance.

Further, among various types of polyorganosiloxane, those consisting primarily of a polymer of octamethyltrisiloxane are particularly preferable. The first and second bonding films 100, 110 consisting primarily of a polymer of octamethyltrisiloxane are particularly superior in adherence property, and therefore, particularly preferable. Further, the material consisting primarily of octamethyltrisiloxane takes a liquid form at normal temperature, and has appropriate viscosity, and therefore, also provides an advantage of easy handling.

Further, the average thickness of the first and second barrier films 120, 130 and the first and second bonding films 100, 110 is preferably in a range of 1 through 1000 nm, and more preferably in a range of 2 through 800 nm. By setting the average thickness of the first and second bonding films 100, 110 to be within this range, it becomes possible to bond the first and second substrates 20, 30 more solidly to each other while preventing the dimensional accuracy from being remarkably degraded. In other words, if the average thickness becomes lower than the lower limit value, there is a possibility that sufficient bonding strength fails to be obtained on the one hand, if the average thickness becomes higher then the upper limit value, the dimensional accuracy might be remarkably degraded on the other hand.

Further, if the average thickness falls within the range described above, a certain level of ability of following a shape can be provided. Therefore, even in the case in which, for example, unevenness exists on the bonding surfaces of the first and second substrates 20, 30, it is possible to make the first and second bonding films 100, 110 adhere to each other so as to follow the shape of the unevenness although depending on the height of the unevenness. As a result, the first and second bonding films 100, 110 can absorb the unevenness to ease the height of the unevenness caused on the surfaces thereof, thereby enhancing the adhesiveness therebetween.

Although such first and second barrier films 120, 130 and first and second bonding films 100, 110 can be manufactured by any method, such as a plasma polymerization method, various types of vapor deposition methods including a CVD method and a PVD method, or various types of liquid phase deposition methods, those manufactured by the plasma polymerization method among these methods are preferable. According to the plasma polymerization method, a dense and homogeneous film can efficiently be manufactured. Thus, the first and second bonding films 100, 110 manufactured by the plasma polymerization method can bond the first and second substrates 20, 30 particularly solidly to each other. Further, in the first and second bonding films 100, 110 manufactured by the plasma polymerization method, the activated state created by providing the activation energy can be maintained for a relatively long period of time. Therefore, simplification and enhancement in efficiency of the manufacturing process of the optical filter 10 can be achieved.

3. Method of Manufacturing Optical Filter 3.1. Manufacturing Process of First Substrate 20

Figure 6A:
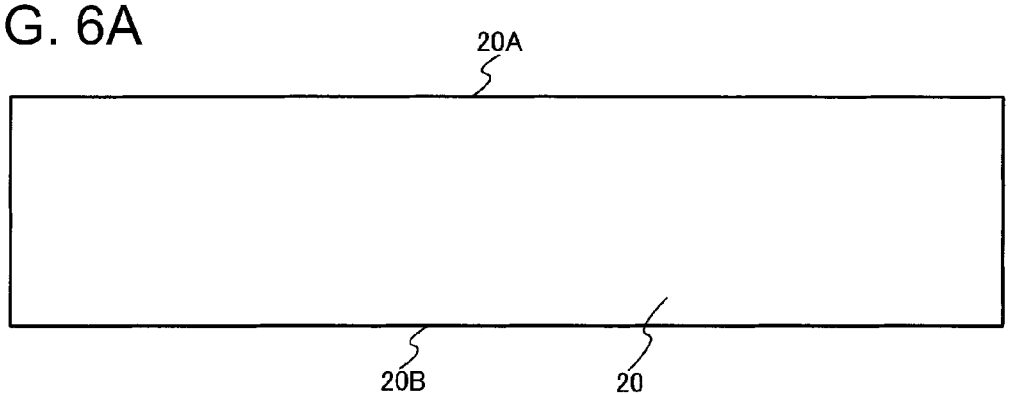
FIGS. 6A through 6C are diagrams respectively showing first through third manufacturing steps of a first substrate.
Figure 6B:
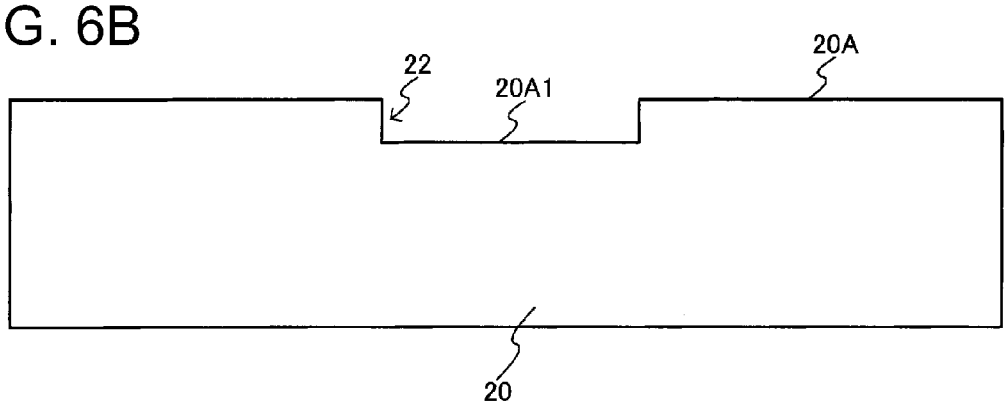
Figure 6C:
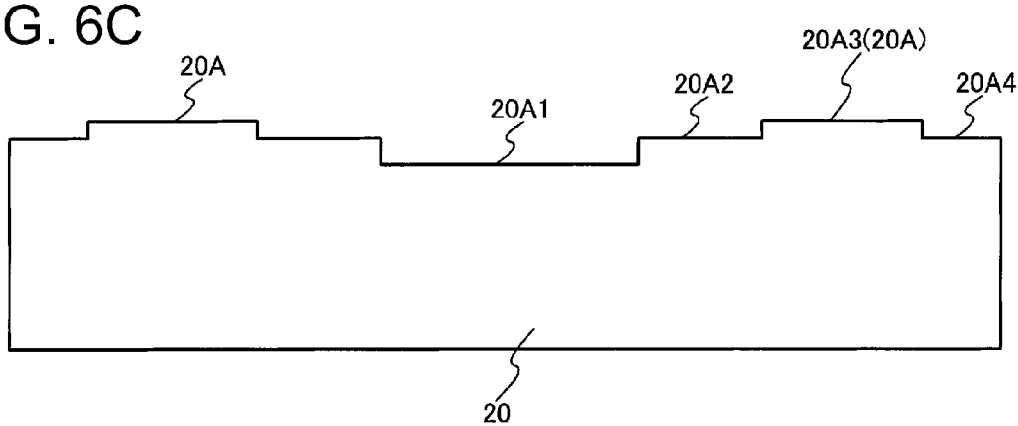

FIGS. 6A through 6C and 7A through 7C show a manufacturing process of the first substrate 20. Firstly, as shown in FIG. 6A, mirror polishing is performed on the both surfaces of a synthetic silica glass substrate to thereby manufacture the first substrate 20 with a thickness of 500 μm.

Subsequently, on the both surfaces 20A, 20B of the first substrate 20, a Cr film with a thickness of, for example, 50 nm is formed, then a mask layer (the same as mask layers 140, 141 shown in FIG. 8B although omitted in FIG. 6B) formed of an Au film with a thickness of 500 nm is formed thereon, then a resist (not shown) is applied to the surface of the mask layer on the side of the one surface 20A, and then resist patterning for forming a recessed section 22 for providing the first opposed surface 20A1 to the one surface 20A is performed. Subsequently, the Au film corresponding to the opening section of the resist is etched with a compound liquid of iodine and potassium iodide, the Cr film is etched with ceric ammonium nitrate solution, and then the recessed section 22 is etched by wet-etching with, for example, hydrofluoric acid solution to have a depth of, for example, about 1.5 μm (see FIG. 6B). Subsequently, the resist and the mask layer are removed from the first substrate 20.

Then, a mask layer is provided to the both surfaces 20A, 20B of the first substrate 20, then a resist (not shown) is applied to the surface of the mask layer of the one surface 20A, and then resist patterning for further providing the second and fourth opposed surfaces 20A2, 20A4 to the surface 20A provided with the recessed section 22 is performed. Subsequently, the Au film and the Cr film in the opening section of the resist are etched, and then the one surface 20A is etched by wet-etching with, for example, hydrofluoric acid solution to have a depth of, for example, about 1 μm (see FIG. 6C). Thus, the second and fourth opposed surfaces 20A2, 20A4 are simultaneously provided to the opposed surface 20A of the first substrate 20, and at the same time, the opposed surface 20A not etched forms the third opposed surface 20A3. Subsequently, the resist and the mask layer are removed from the first substrate 20.

Then, an ITO film is deposited on the entire etched surface of the first substrate 20 with a thickness of, for example, 0.1 μm using a sputtering method. A resist is applied to the surface of the ITO film, then resist patterning is performed, then the ITO film is etched with a compound liquid of, for example, nitric acid and hydrochloric acid, and then resist is removed. Thus, the first electrode 60 is provided to the second opposed surface 20A2 of the first substrate 20, and the first wiring layer 62 and the relay wiring layer 62B are provided to the fourth opposed surface 20A4 of the first substrate 20 (see FIG. 7A).

Then, resist patterning for forming an opening only in the area on the first substrate 20 where the first reflecting film 40 is formed is performed, and then the reflecting film materials are deposited by a sputtering method or an evaporation method. The first reflecting film materials are stacked in the order of, for example, an $SiO_2$ layer with a thickness of 50 nm, a $TiO_2$ layer with a thickness of 50 nm, and an Ag layer with a thickness of 50 nm from the side of the second substrate 30. Subsequently, the first reflecting film materials are lifted off by removing the resist, and the first reflecting film materials remain only in the area where the resist has the opening, thereby forming the first reflecting film 40 (see FIG. 7B).

Then, resist patterning for forming an opening in each of the areas to be provided with the first bonding film 100A and the first barrier film 120 is performed, and then the plasma-polymerized film functioning as both of the bonding film and the barrier film is deposited by a plasma CVD method to have a thickness of, for example, 30 nm. In the present embodiment, it is assumed that the first bonding film 100A and the first barrier film 120 are deposited in the same process. The plasma-polymerized film can be provided with a high gas barrier property because the siloxane bonds (Si—O—Si) block the passing route of the gas, and therefore, becomes to have characteristics with low reactivity and hard to be oxidized or sulfurized. Further, the siloxane bond (Si—O—Si) absorbs light with a wavelength equal to or shorter than 200 nm including the wavelength band of ultraviolet rays similarly to the case of $SiO_2$. If the first barrier film 120 absorbs the ultraviolet ray, the first barrier film 120 is exited to rise in the energy state, but is not changed in the state because the bond energy of the siloxane bond (Si—O—Si) is greater than the excitation energy due to the ultraviolet radiation. As the primary material of the plasma-polymerized film, polyorganosiloxane described above is preferably used. In the plasma polymerization, the frequency of the high frequency power applied between the pair of electrodes is in a range of 1 through 100 kHz, preferably in a range of 10 through 60 kHz, the inner pressure of the chamber is in a range of $1\times10^{-5}$ through 10 Torr, preferably in a range of $1\times10^{-4}$ through 1 Torr ($133.3\times10^{-4}$ through 133.3 Pa), the material gas flow rate is in a range of 0.5 through 200 sccm, preferably in a range of 1 through 100 sccm, the carrier gas flow rate is in a range of 5 through 750 sccm, preferably in a range of 10 through 500 sccm, and the process time is in a range of 1 through 10 minutes, preferably in a range of 4 through 7 minutes.

Figure 7A:
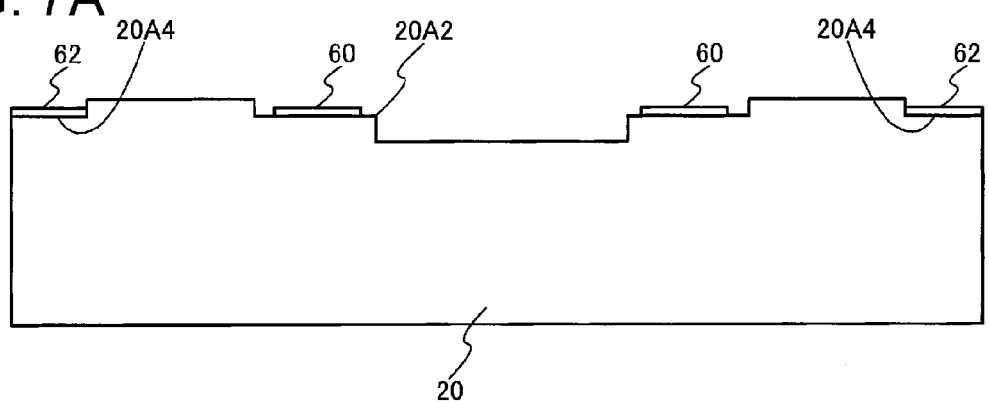
FIGS. 7A through 7C are diagrams respectively showing fourth through sixth manufacturing steps of the first substrate.
Figure 7B:
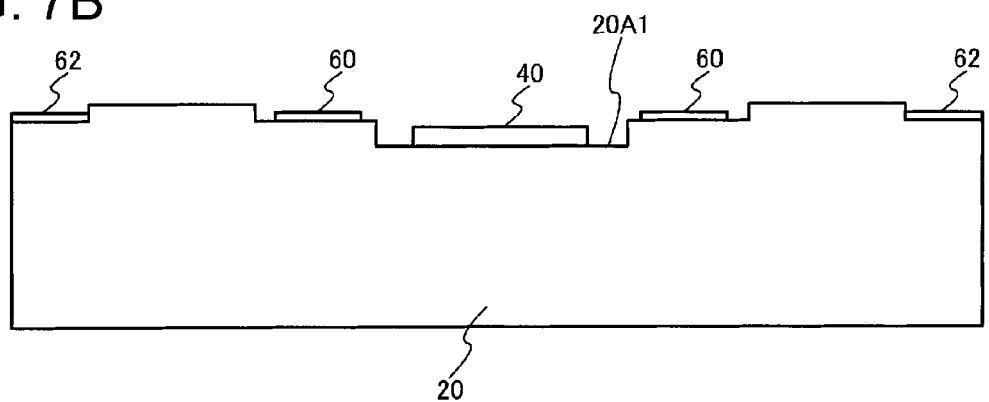
Figure 7C:
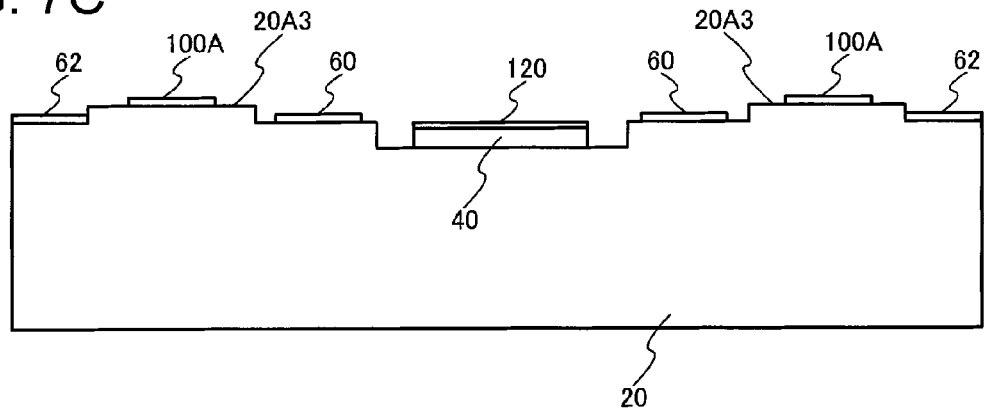

Subsequently, the plasma-polymerized film is lifted off by removing the resist, thereby forming the first bonding film 100A and the first barrier film 120 (see FIG. 7C). Thus, the first substrate 20 is completed.

3.2. Manufacturing Process of Second Substrate 30

FIGS. 8A through 8D and 9A through 9D show a manufacturing process of the second substrate 30. Firstly, mirror polishing is performed on the both surfaces of a synthetic silica glass substrate to thereby manufacture the second substrate 30 with a thickness of 200 μm (see FIG. 8A).

Figure 8A:
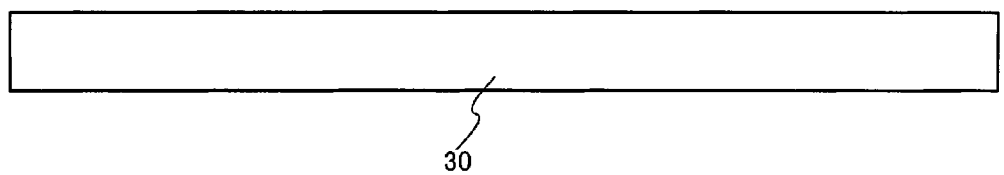
FIGS. 8A through 8D are diagrams respectively showing first through fourth manufacturing steps of a second substrate.
Figure 8B:
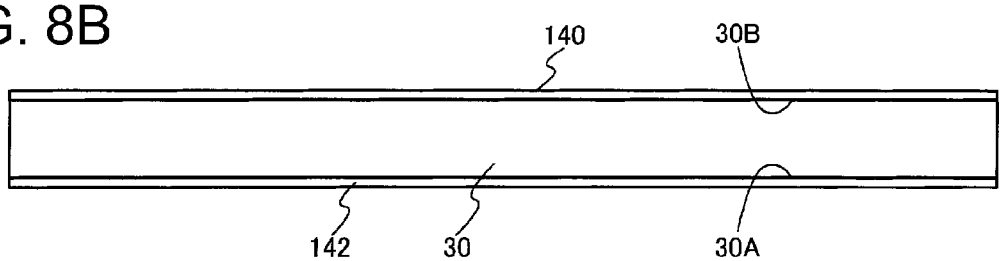
Figure 8C:
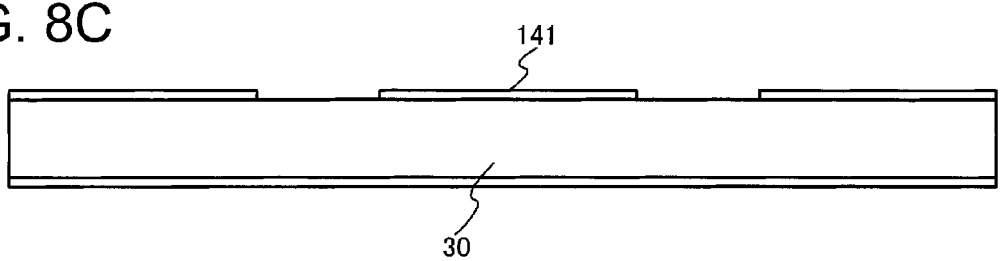

Then, Cr films with a thickness of, for example, 50 nm are deposited on the both surfaces 30A, 30B of the second substrate 30, and then mask layers 140, 142 each formed of an Au film and with a thickness of 500 nm are deposited thereon (see FIG. 8B).

Subsequently, a resist (not shown) is applied to the surface of the mask layer 140 of the second substrate 30, and then resist patterning for providing the diaphragm section 32 (see FIG. 3) to the one surface 30B is performed. Subsequently, the Au film of the mask layer 140 is etched with a compound liquid of iodine and potassium iodide, and then the Cr film of the mask layer 140 is etched with ceric ammonium nitrate solution, thereby forming the mask layer 141 having been patterned (see FIG. 8C).

Figure 8D:
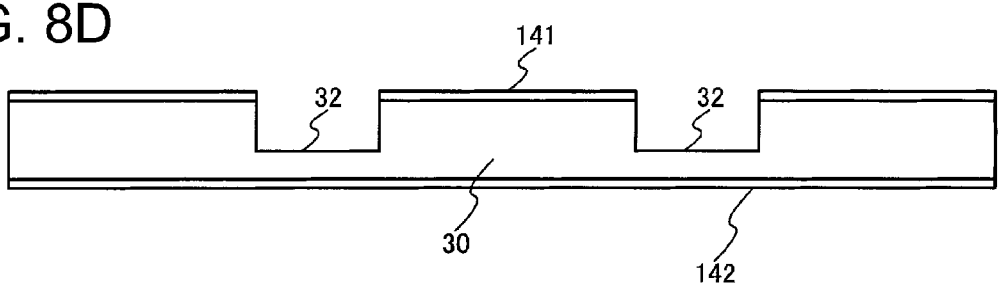

Then, the second substrate 30 is dipped in a hydrofluoric acid solution to thereby etch the diaphragm section 32 as much as, for example, about 150 μm (see FIG. 8D). The thickness of the diaphragm section 32 becomes, for example, about 50 μm, and the thick-wall area including the reflecting film support section 34 remains with a thickness of 200 μm.

Figure 9A:
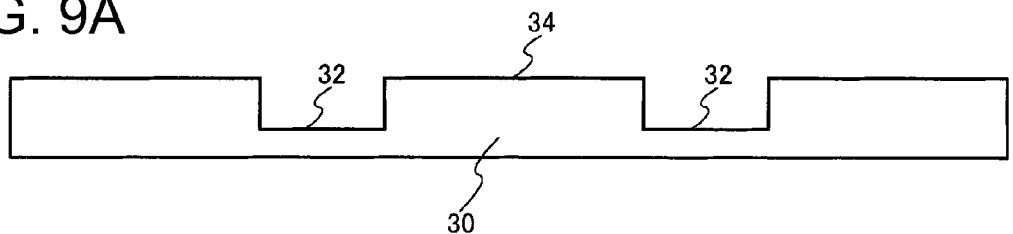
FIGS. 9A through 9D are diagrams respectively showing fifth through eighth manufacturing steps of the second substrate.
Figure 9B:
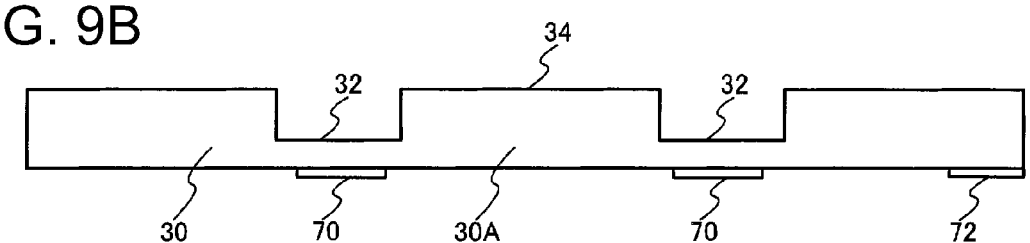
Figure 9C:
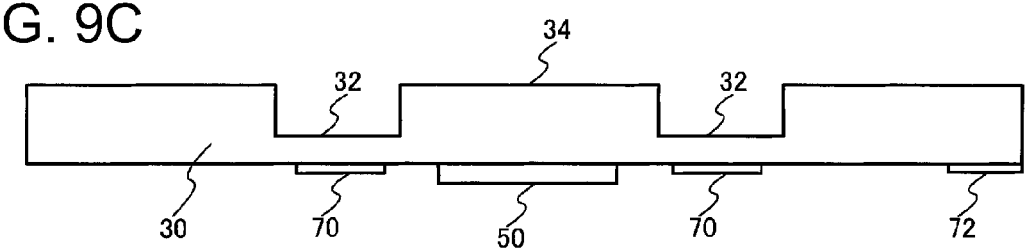
Figure 9D:
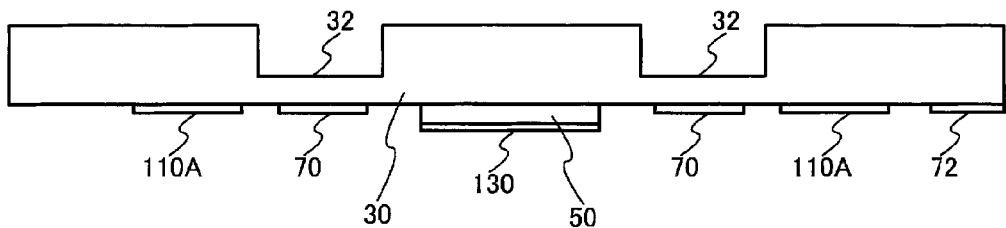

Subsequently, the resist and the mask layers 141, 142 attached to the both surfaces 30A, 30B of the second substrate 30 are removed (see FIG. 9A).

Then, an ITO film is deposited on the opposite surface 30A to the etched surface 30B of the second substrate 30 with a thickness of, for example, 0.1 μm using a sputtering method. A resist is applied to the surface of the ITO film, then the resist patterning for the second electrode 70 and the second wiring layer 72 is performed, and then the ITO film is etched with a compound liquid of nitric acid and hydrochloric acid. Subsequently, the resist is removed from the second substrate 30 (see FIG. 9B).

Then, resist patterning for forming an opening only in the area where the second reflecting film 50 is formed is performed on the one surface 30A of the second substrate 30 provided with the second electrode 70, and then the second reflecting film materials are deposited by a sputtering method or an evaporation method. As an example of the deposition, the second reflecting film materials are stacked in the order of, for example, an $SiO_2$ layer with a thickness of 50 nm, a $TiO_2$ layer with a thickness of 50 nm, and an Ag layer with a thickness of 50 nm from the side of the second substrate 30. Subsequently, the second reflecting film materials are lifted off by removing the resist, thereby forming the second reflecting film 50 (see FIG. 9C).

Then, resist patterning for forming an opening in each of the areas to be provided with the second bonding film 110A and the second barrier film 130 is performed, and then the plasma-polymerized film functioning as both of the bonding film and the barrier film is deposited by a plasma CVD method to have a thickness of, for example, 30 nm. In the present embodiment, it is assumed that the second bonding film 110A and the second barrier film 130 are deposited simultaneously. The plasma-polymerized film can be provided with a high gas barrier property because the siloxane bonds (Si—O—Si) block the passing route of the gas, and therefore, becomes to have characteristics with low reactivity and hard to be oxidized or sulfurized. Further, the siloxane bond (Si—O—Si) absorbs light with a wavelength equal to or shorter than 200 nm including the wavelength band of ultraviolet rays similarly to the case of $SiO_2$. If the second barrier film 130 absorbs the ultraviolet ray, the second barrier film 130 is exited to rise in the energy state, but is not changed in the state because the bond energy of the siloxane bond (Si—O—Si) is greater than the excitation energy due to the ultraviolet radiation. As the primary material of the plasma-polymerized film, polyorganosiloxane described above is preferably used. Subsequently, the plasma-polymerized film is lifted off by removing the resist, thereby forming the second bonding film 110A and the second barrier film 130 (see FIG. 9D). Thus, the second substrate 30 is completed.

3.3. Activation Energy Provision Process

FIG. 10 shows a process of providing the activation energy to the first bonding film 100A of the first substrate 20 to thereby form the first bonding film 100B having been activated. FIG. 11 shows a process of providing the activation energy to the second bonding film 110A of the second substrate 30 to thereby form the second bonding film 110B having been activated. There are various kinds of methods for providing the activation energy to the first and second bonding films 100A, 110A, and two examples will be explained here.

One is the activation using ozone, and for example, an $O_2$ plasma process can be cited. In the case of the $O_2$ plasma process, under the conditions in which the $O_2$ flow rate is in a range of, for example, 20 through 40 cc/min, the pressure is in a range of, for example, 20 through 35 Pa, the RF power is in a range of, for example, 150 through 250 W, the first and second substrates 20, 30 are each processed for, for example, 10 through 40 seconds in the plasma processing container.

The other is the activation using ultraviolet (UV) irradiation, in which a UV light source having an emission wavelength range of 150 through 300 nm, preferably 160 through 200 nm is used, and the ultraviolet ray is applied to the first and second bonding films 100A, 110A not yet activated with a distance in a range of 3 through 3000 nm, preferably in a range of 10 through 1000 nm for 1 through 10 minutes, for example, a few minutes.

It is possible to process the first and second substrates 20, 30 separately as shown in FIGS. 10 and 11, or in particular in the case of the ultraviolet irradiation, it is also possible to stack the first and second substrates 20, 30 and then irradiate the bonding films with the ultraviolet ray via the first substrate 20, the second substrate 30, or both of the first and second substrates 20, 30 made of, for example, quartz glass.

In this activation energy provision process, as described above, the elimination groups 303 are eliminated from the Si skeleton 301 of the first and second bonding films 100A, 110A not yet activated, and the active hands 304 are generated by the provision of the activation energy in the first and second bonding films 100B, 110B having been provided with the activation energy, and thus the first and second bonding films are activated. Further, in the activation energy provision process, as described above, the first and second barrier films 120, 130 can protect the first and second reflecting films 40, 50 from ozone or ultraviolet radiation.

In particular, in the present embodiment, as shown in FIGS. 10 and 11, the first and second mask members 140, 150 prevent the ozone or the ultraviolet ray from entering the surfaces of the first and second barrier films 120, 130 to thereby keep the first and second barrier films 120, 130 in the inactive state shown in FIG. 2. The first mask member 140 has a first opening 142 at a position opposed to the first bonding film 100A, and provides the activation energy only to the first bonding film 100A. Similarly, the second mask member 150 has a second opening 152 at a position opposed to the second bonding film 110A, and provides the activation energy only to the second bonding film 110A.

The first and second mask members 140, 150 are detachably attached respectively to the first and second substrates 20, 30. In practice, a number of optical filters 10 are simultaneously formed on each of the first and second substrates 20, 30, and the first and second substrates 20, 30 are broken into individual optical filters 10 after being bonded. On this occasion, it is possible to attach the first and second mask members 140, 150 provided with a number of openings 142, 152 respectively to the first and second substrates 20, 30.

The first and second mask members 140, 150 can be made to adhere to the outermost layers of the first and second substrates 20, 30, or can also be provided contactlessly with the outermost layer so as not to injure the outermost layer.

3.4. Bonding Process of First and Second Substrates

Figure 12:
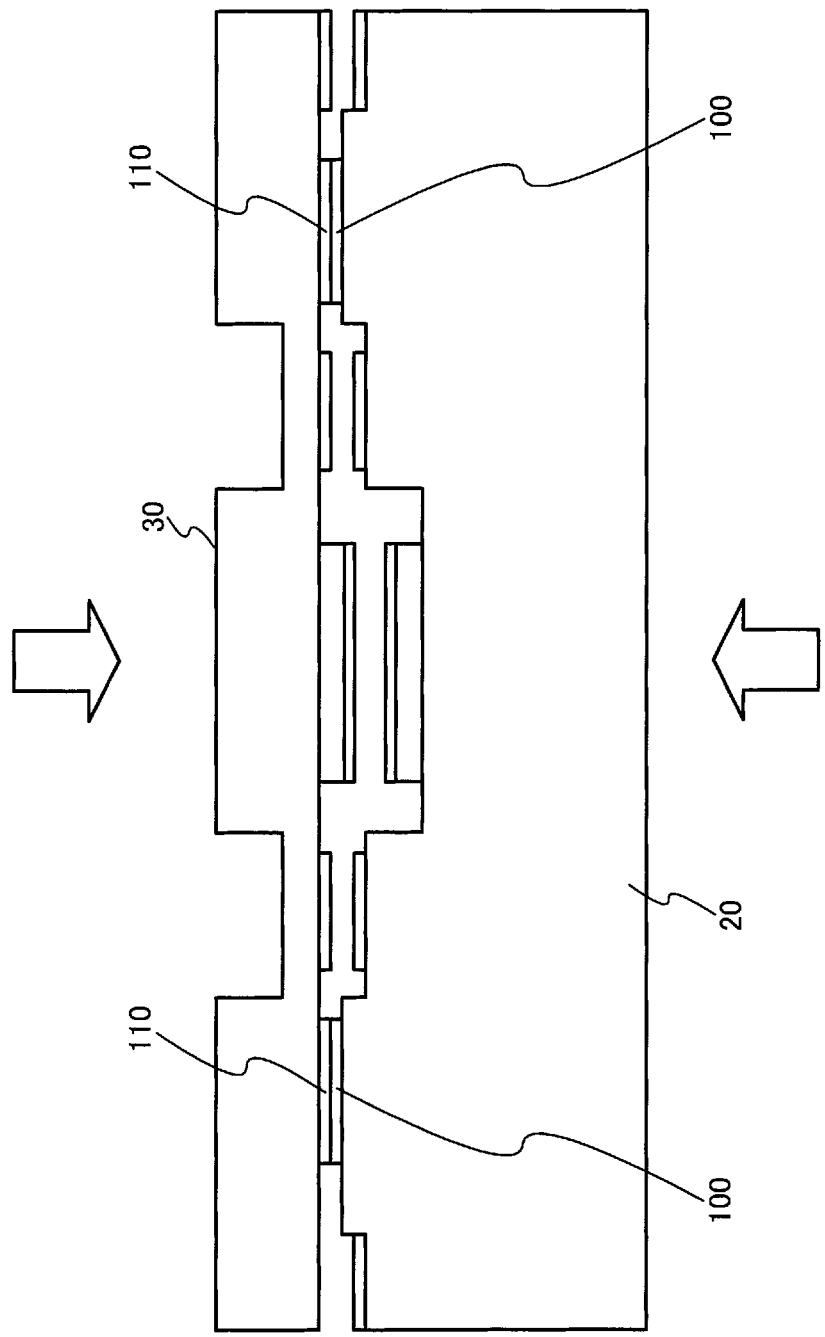
FIG. 12 is a diagram showing a bonding process of the first and second substrates.

After providing the activation energy, alignment of the first and second substrates 20, 30 is performed, and the first and second substrates 20, 30 are overlapped each other as shown in FIG. 12, and the load is applied thereto. On this occasion, as described above, the active hands (dangling bonds) 304 of the first and second bonding films 100B, 110B provided with the activation energy are bonded to each other to thereby solidly bond the first and second bonding films 100, 110 to each other. Thus, the bond between the first and second substrates 20, 30 is completed. Subsequently, the first electrode lead-out section 64 shown in FIG. 4 and the second electrode lead-out section 74 for connecting the second electrode 70 to an external device are formed, thereby completing the optical filter 10.

4. Analytical Instrument

Figure 13:
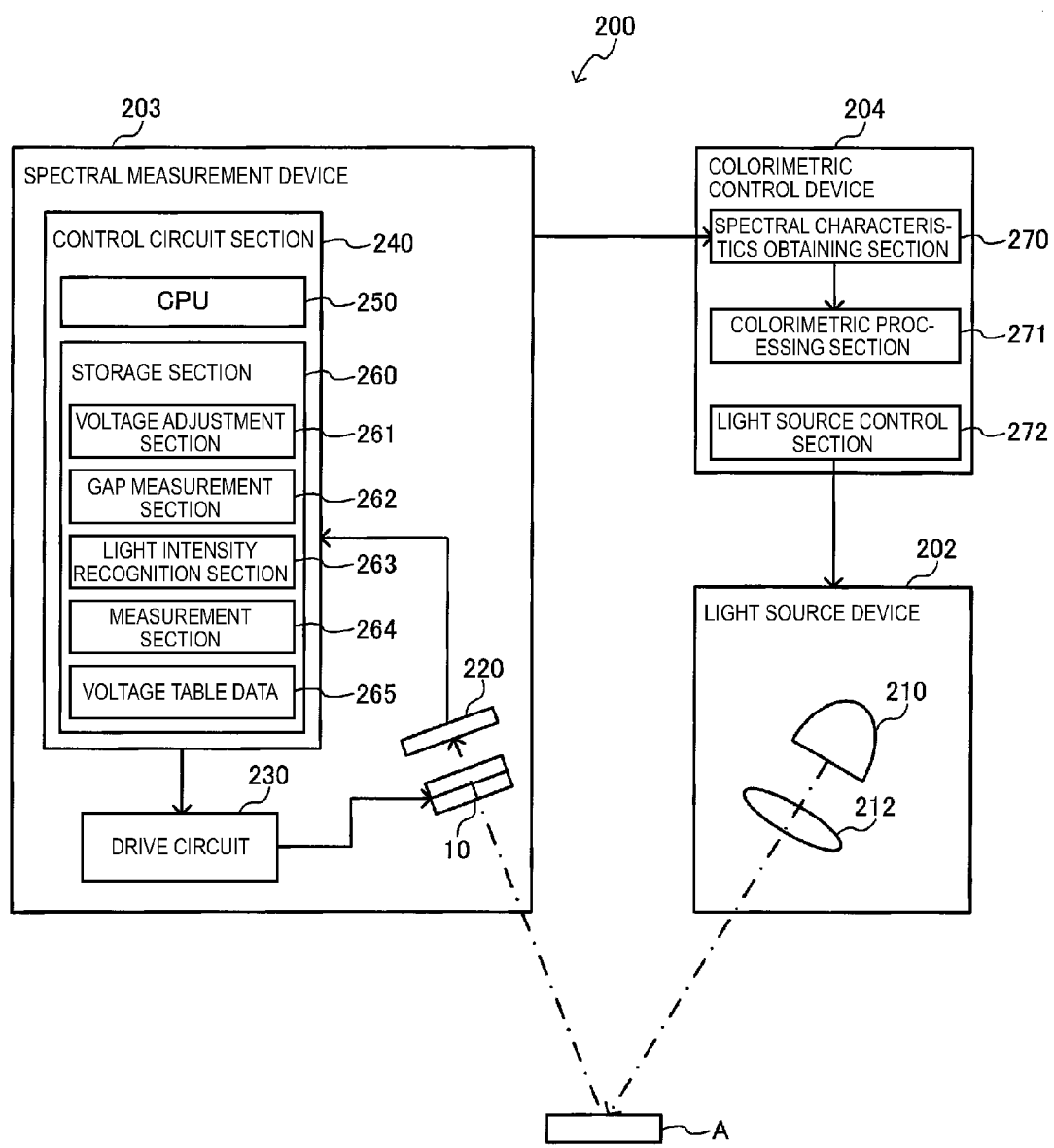
FIG. 13 is a block diagram of an analytical instrument using the optical filter.

FIG. 13 is a block diagram showing a schematic configuration of a colorimeter as an example of an analytical instrument using the optical filter as the bonded member according to the invention.

In FIG. 13, the colorimeter 200 is provided with a light source device 202, a spectral measurement device 203, and a colorimetric control device 204. The colorimeter 200 emits, for example, a white light beam from the light source device 202 toward the test object A, and then input the test target light beam, the light beam reflected by the test object A, to the spectral measurement device 203. Subsequently, the colorimeter 200 disperses the test target light beam with the spectral measurement device 203, and then spectral characteristics measurement for measuring the intensity of each of the light beams with respective wavelengths obtained by the dispersion is performed. In other words, the colorimeter 200 makes the test target light beam as the light beam reflected by the test object A enter the optical filter (an etalon) 10, and then performs the spectral characteristics measurement for measuring the intensity of the light beam transmitted through the etalon 10. Subsequently, the colorimetric control device 204 performs the colorimetric process of the test object A, namely analyzes the wavelengths of the colored light beams included therein, and the proportions of the colored light beams, based on the spectral characteristics thus obtained.

The light source device 202 is provided with alight source 210 and a plurality of lenses 212 (one of the lenses alone is shown in FIG. 13), and emits a white light beam to the test object A. Further, the plurality of lenses 212 includes a collimator lens, and the light source device 202 modifies the white light beam emitted from the light source 210 into a parallel light beam with the collimator lens, and emits it from the projection lens not shown to the test object A.

As shown in FIG. 13, the spectral measurement device 203 is provided with the etalon 10, a light receiving section 220 as the light receiving section, a drive circuit 230, and a control circuit section 240. Further, the spectral measurement device 203 has an entrance optical lens not shown disposed at a position opposed to the etalon 10, the entrance optical lens guiding the reflected light beam (the test target light beam) reflected by the test object A into the inside thereof.

The light receiving section 220 is composed of a plurality of photoelectric conversion elements, and generates an electric signal corresponding to the received light intensity. Further, the light receiving section 220 is connected to the control circuit section 240, and outputs the electric signal thus generated to the control circuit section 240 as a light reception signal.

The drive circuit 230 is connected to the first electrode 60 and the second electrode 70 of the etalon 10, and the control circuit section 240. The drive circuit 230 applies the drive voltage between the first electrode 60 and the second electrode 70 based on the drive control signal input from the control circuit section 240 to thereby displace the second substrate 30 to a predetermined displacement position. The drive voltage can be applied so that the desired electrical potential difference is caused between the first electrode 60 and the second electrode 70, and for example, it is also possible to apply a predetermined voltage to the first electrode 60 while setting the second electrode 70 to the ground potential. A direct-current voltage is preferably used as the drive voltage.

The control circuit section 240 controls overall operations of the spectral measurement device 203. As shown in FIG. 13, the control circuit section 240 is mainly composed of, for example, a CPU 250 and a storage section 260. Further, the CPU 250 performs a spectral measurement process based on various programs and various data stored in the storage section 260. The storage section 260 is configured including a recording medium such as a memory or a hard disk drive, and stores the various programs and various data so as to be arbitrarily retrieved.

Here, the storage section 260 stores a voltage adjustment section 261, a gap measurement section 262, a light intensity recognition section 263, and a measurement section 264 as programs. It should be noted that as described above the gap measurement section 262 can be omitted.

Further, the storage section 260 stores voltage table data 265 containing voltage values to be applied to the electrostatic actuator 80 for controlling the spacing of the first gap G1 and the time periods, during which the respective voltage values are applied, in conjunction with each other.

The colorimetric control device 204 is connected to the spectral measurement device 203 and the light source device 202, and performs the control of the light source device 202 and the colorimetric process based on the spectral characteristics obtained by the spectral measurement device 203. As the colorimetric control device 204, a general-purpose personal computer, a handheld terminal, a colorimetric-dedicated computer, and so on can be used.

Further, as shown in FIG. 13, the colorimetric control device 204 is configured including a light source control section 272, a spectral characteristics obtaining section 270, a colorimetric processing section 271, and so on.

The light source control section 272 is connected to the light source device 202. Further, the light source control section 272 outputs a predetermined control signal to the light source device 202 based on, for example, a setting input by the user to thereby make the light source device 202 emit a white light beam with a predetermined brightness.

The spectral characteristics obtaining section 270 is connected to the spectral measurement device 203, and obtains the spectral characteristics input from the spectral measurement device 203.

The colorimetric processing section 271 performs the colorimetric process for measuring the chromaticity of the test object A based on the spectral characteristics. For example, the colorimetric processing section 271 performs a process of making a graph of the spectral characteristics obtained from the spectral measurement device 203, and then outputting it to an output device such as a printer or a display not shown.

Figure 14:
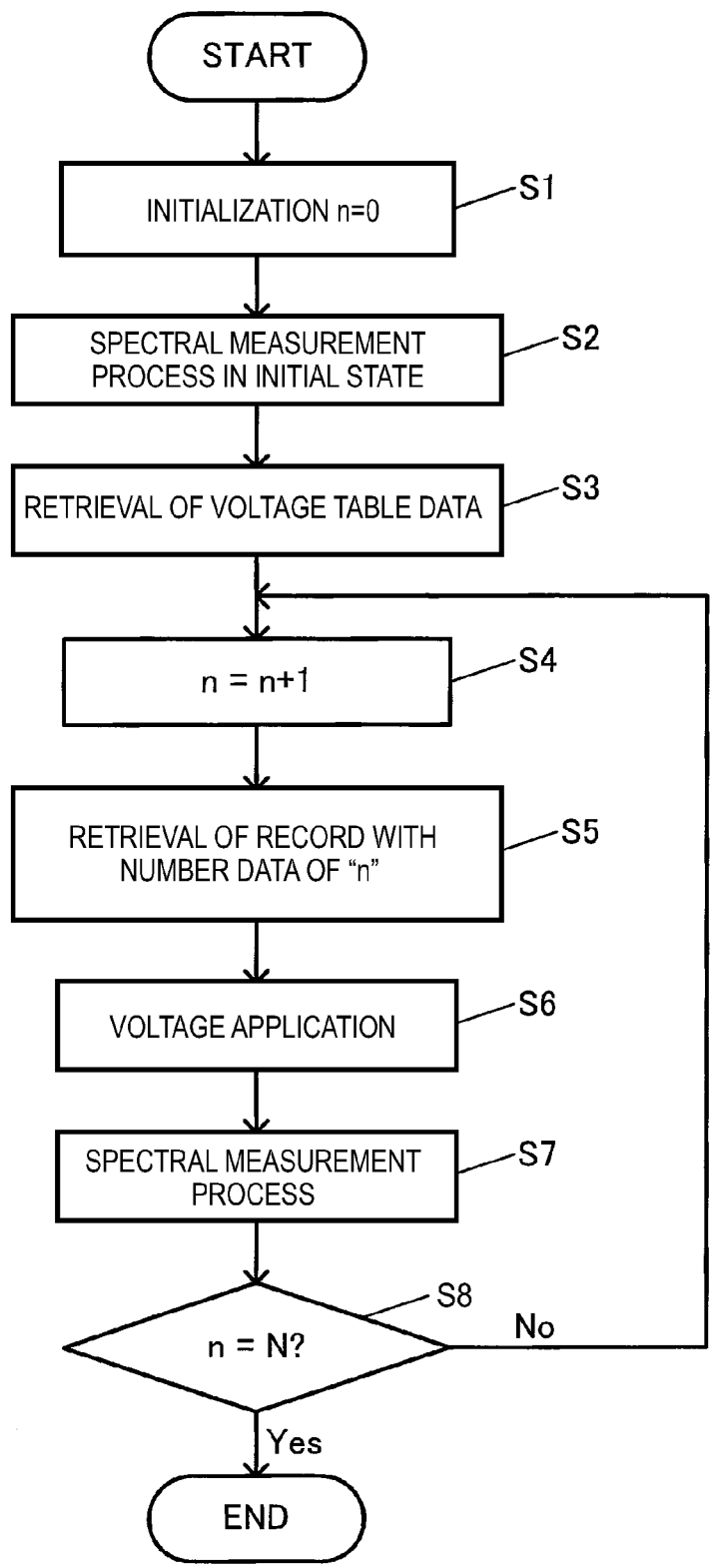
FIG. 14 is a flowchart showing a spectral measurement operation in the instrument shown in FIG. 13.

FIG. 14 is a flowchart showing the spectral measurement operation of the spectral measurement device 203. Firstly, the CPU 250 of the control circuit section 240 starts up the voltage adjustment section 261, the light intensity recognition section 263, and the measurement section 264. Further, the CPU 250 initializes a measurement count variable "n" (set n=0) as an initial state (step S1). It should be noted that the measurement count variable n takes an integer value equal to or larger than 0.

Subsequently, the measurement section 264 measures (step S2) the intensity of the light beam transmitted through the etalon 10 in the initial state, namely the state in which no voltage is applied to the electrostatic actuator 80. It should be noted that it is also possible to previously measure the dimension of the first gap G1 in the initial state, for example, at the time of manufacturing of the spectral measurement device and store it in the storage section 260. Then, the measurement section 264 outputs the intensity of the transmitted light beam and the dimension of the first gap G1 in the initial state obtained here to the colorimetric control device 204.

Subsequently, the voltage adjustment section 261 retrieves (step S3) the voltage table data 265 stored in the storage section 260. Further, the voltage adjustment section 261 adds (step S4) "1" to the measurement count variable n.

Subsequently, the voltage adjustment section 261 obtains (step S5) the voltage data of the first and second electrodes 60, 70 and the voltage application period data corresponding to the measurement count variable n from the voltage table data 265. Then, the voltage adjustment section 261 outputs the drive control signal to the drive circuit 230 to thereby perform (step S6) the process of driving the electrostatic actuator 80 in accordance with the data of the voltage table data 265.

Further, the measurement section 264 performs (step S7) the spectral measurement process at the application time elapse timing. Specifically, the measurement section 264 makes the light intensity recognition section 263 measure the intensity of the transmitted light. Further, the measurement section 264 performs the control of outputting the spectral measurement result, which includes the intensity of the transmitted light beam thus measured and the wavelength of the transmitted light beam in conjunction with each other, to the colorimetric control device 204. It should be noted that in the measurement of the light intensity, it is also possible to store the data of the light intensity of a plurality of times of measurement or all of the times of the measurement in the storage section 260, and then measure the light intensity of each of the times of the measurement in a lump after the data of the light intensity of a plurality of times of measurement or all of the data of the light intensity has been obtained.

Subsequently, the CPU 250 determines (step S8) whether or not the measurement count variable n reaches the maximum value N, and if it determines that the measurement count variable n is equal to N, it terminates the series of spectral measurement operation. In contrast, if it is determined in the step S8 that the measurement count variable n is smaller than N, the CPU 250 returns to the step S4 and performs the process of adding "1" to the measurement count variable n, and then repeats the process of the steps S5 through S8.

5. Optical Apparatus

Figure 15:
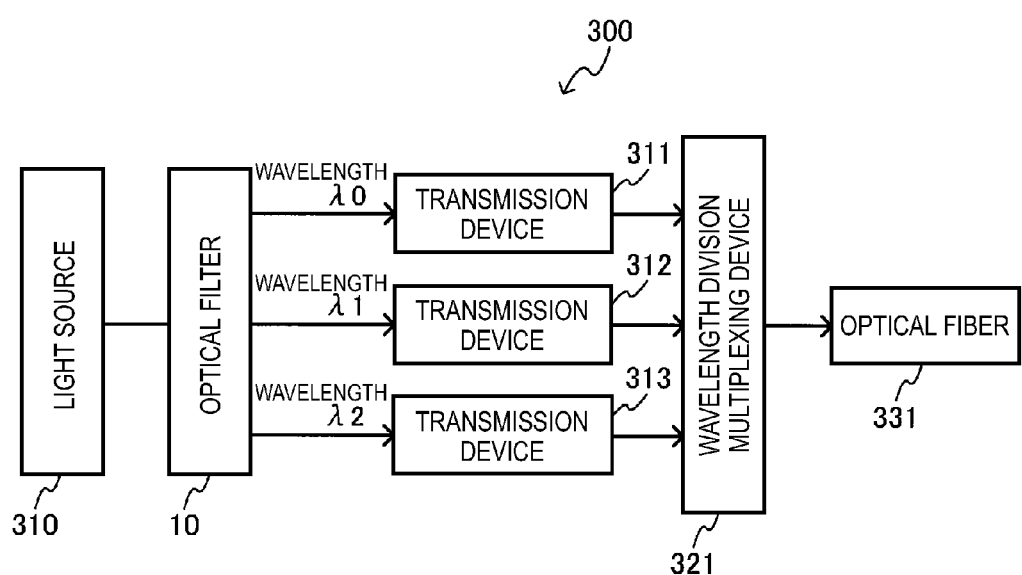
FIG. 15 is a block diagram of an optical apparatus using the optical filter.

FIG. 15 is a block diagram showing a schematic configuration of a transmitter of a wavelength division multiplexing system as an example of an optical apparatus using the optical filter as the bonded member according to the invention. In the wavelength division multiplexing (WDM) communication, using the property of the light that the signals with respective wavelengths different from each other do not interfere each other, by using a plurality of light signals with respective wavelengths different from each other in a single optical fiber in a multiplexed manner, it becomes possible to increase the data transmission quantity without expanding the optical fiber lines.

In FIG. 15, a wavelength division multiplexing transmitter 300 has an optical filter 10 to which a light beam from a light source 310 is input, and a plurality of light beams with respective wavelengths $\lambda 0$, $\lambda 1$, $\lambda 2$, . . . is transmitted through the optical filter 10. Transmission devices 311, 312, and 313 are provided corresponding to the respective wavelengths. Optical pulse signals corresponding to a plurality of channels output from the transmission devices 311, 312, and 313 are combined by a wavelength division multiplexing device 321 into one signal, and then output to an optical fiber transmission channel 331.

The invention can also be applied to an optical code division multiplexing (OCDM) transmitter in a similar manner. This is because although in the OCDM the channels are discriminated by pattern matching of encoded optical pulse signals, the optical pulses constituting the optical pulse signals include light components with respective wavelengths different from each other.

Although some embodiments are hereinabove explained, it should easily be understood by those skilled in the art that various modifications not substantially departing from the novel matters and the effects of the invention are possible. Therefore, such modified examples should be included in the scope of the invention. For example, a term described at least once with a different term having a broader sense or the same meaning in the specification or the accompanying drawings can be replaced with the different term in any part of the specification or the accompanying drawings.

The entire disclosure of Japanese Patent Application No. 2010-058302, filed Mar. 15, 2010 is expressly incorporated by reference herein.

What is claimed is:

1. A method of manufacturing an optical filter comprising:
    (a) providing a first substrate having a first reflecting film, and a first bonding area disposed in a periphery of the first reflecting film;
    (b) forming a first barrier film on the first reflecting film, and a first bonding film in the first bonding area;
    (c) providing a second substrate having a second reflecting film, and a second bonding area disposed in a periphery of the second reflecting film;
    (d) forming a second barrier film on the second reflecting film, and a second bonding film in the second bonding area;
    (e) irradiating the first bonding film with an ultraviolet ray via a first mask member or exposing the first bonding film with an ozone gas via the first mask member;
    (f) irradiating the second bonding film with an ultraviolet ray via a second mask member or exposing the second bonding film with an ozone gas via the second mask member; and
    (g) bonding the first bonding film and the second bonding film to each other to thereby bond the first substrate and the second substrate to each other,
    wherein in step (e), the first mask member has a first opening section located above the first bonding area, and a part of the first mask member is located above the first reflecting film,
    in step (b), the first bonding film includes an Si skeleton having a siloxane bond, and an elimination group connected to the Si skeleton,
    in step (d), the second bonding film includes an Si skeleton having a siloxane bond, and an elimination group connected to the Si skeleton,
    the elimination group is eliminated from the Si skeleton of the first bonding film to thereby form a dangling bond by step (e),
    the elimination group is eliminated from the Si skeleton of the second bonding film to thereby form a dangling bond by step (f), and
    in step (g), the dangling bond of the first bonding film and the dangling bond of the second bonding film are bonded to each other to thereby bond the first bonding film and the second bonding film to each other.

2. The method according to claim 1, wherein
wherein in step (f), the second mask member has a second opening section located above the second bonding area, and a part of the second mask member is located above the second reflecting film.

3. The method according to claim 1, wherein
the first barrier film and the first bonding film are formed in the same process, and
the second barrier film and the second bonding film are formed in the same process.

4. The method according to claim 1, wherein
a material of the first barrier film and a material of the first bonding film are different from each other, and
a material of the second barrier film and a material of the second bonding film are different from each other.

5. The method according to claim 1, wherein
in step (e), the first mask member is separate from the first barrier film, and in step (f), the second mask member is separate from the second barrier film.

6. The method according to claim 1, wherein
in step (a), the first substrate is provided with a first electrode formed in an area between the first reflecting film and the first bonding area, and
in step (c), the second substrate is provided with a second electrode formed in an area between the second reflecting film and the second bonding area.

7. An analytical instrument comprising an optical filter manufactured by the method of manufacturing an optical filter according to claim 1.

8. An optical apparatus comprising an optical filter manufactured by the method of manufacturing an optical filter according to claim 1.

* * * * *